(12) United States Patent
Kurihara

(10) Patent No.: US 10,186,651 B2
(45) Date of Patent: Jan. 22, 2019

(54) OXIDE SUPERCONDUCTING WIRE AND METHOD OF MANUFACTURING OXIDE SUPERCONDUCTING WIRE

(71) Applicant: FUJIKURA LTD., Koto-ku, Tokyo (JP)

(72) Inventor: Chihaya Kurihara, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 89 days.

(21) Appl. No.: 15/117,502

(22) PCT Filed: May 7, 2015

(86) PCT No.: PCT/JP2015/063184
§ 371 (c)(1),
(2) Date: Aug. 9, 2016

(87) PCT Pub. No.: WO2015/170699
PCT Pub. Date: Nov. 12, 2015

(65) Prior Publication Data
US 2016/0359097 A1 Dec. 8, 2016

(30) Foreign Application Priority Data

May 8, 2014 (JP) .................. 2014-096582
Dec. 12, 2014 (JP) .................. 2014-251933

(51) Int. Cl.
*H01L 39/12* (2006.01)
*H01B 12/02* (2006.01)
(Continued)

(52) U.S. Cl.
CPC .......... *H01L 39/128* (2013.01); *H01B 12/02* (2013.01); *H01L 39/143* (2013.01); *H01L 39/2461* (2013.01)

(58) Field of Classification Search
CPC ...... H01L 39/12–39/2461; H01B 12/00–12/03
See application file for complete search history.

(56) References Cited

U.S. PATENT DOCUMENTS

2006/0258539 A1* 11/2006 Matsumoto ............ C23C 14/02
505/100
2007/0145100 A1 6/2007 Suzuki et al.
(Continued)

FOREIGN PATENT DOCUMENTS

EP 1 933 335 A1 6/2008
EP 2 495 735 A1 9/2012
(Continued)

OTHER PUBLICATIONS

Internal Search Report for PCT/JP2015/063184 dated Jul. 7, 2016.
Communication dated Jan. 5, 2018, from European Patent Office in counterpart application No. 15789213.4.

*Primary Examiner* — Colleen P Dunn
(74) *Attorney, Agent, or Firm* — Sughrue Mion, PLLC

(57) ABSTRACT

An oxide superconducting wire of the invention includes a substrate, an intermediate layer which is laminated on a main surface of the substrate, has one or more layers having an orientation, and has one or more non-orientation regions extending in a longitudinal direction of the wire, and an oxide superconducting layer which is laminated on the intermediate layer, has a crystal orientation controlled by the intermediate layer, and has non-orientation regions located on the non-orientation regions in the intermediate layer and is formed into multiple filaments.

22 Claims, 10 Drawing Sheets

(51) Int. Cl.
*H01L 39/14* (2006.01)
*H01L 39/24* (2006.01)

(56) References Cited

U.S. PATENT DOCUMENTS

| | | |
|---|---|---|
| 2007/0191202 A1 | 8/2007 | Foltyn et al. |
| 2008/0004184 A1* | 1/2008 | Ohmatsu ................ H01B 12/06 505/191 |
| 2012/0015818 A1* | 1/2012 | Schlenga .............. H01L 39/143 505/237 |

FOREIGN PATENT DOCUMENTS

| | | |
|---|---|---|
| JP | 2005-78939 A | 3/2005 |
| JP | 2007-87734 A | 4/2007 |
| JP | 2007-141688 A | 6/2007 |
| JP | 2011-96566 A | 5/2011 |
| JP | 2013-196768 A | 9/2013 |
| WO | 2005/022562 A1 | 3/2005 |

\* cited by examiner

NON-SUPERCONDUCTING PORTION

OXIDE SUPERCONDUCTING WIRE AND
METHOD OF MANUFACTURING OXIDE
SUPERCONDUCTING WIRE

CROSS REFERENCE TO RELATED
APPLICATIONS

This application is a National Stage of International Application No. PCT/JP2015/063184 filed May 7, 2015, claiming priority based on Japanese Patent Application Nos. 2014-096582 filed May 8, 2014 and 2014-251933 filed on Dec. 12, 2014, the contents of all of which are incorporated herein by reference in their entirety.

TECHNICAL FIELD

The present invention relates to an oxide superconducting wire and a method of manufacturing an oxide superconducting wire.

This application claims priority from Japanese Patent Application No. 2014-96582, filed on May 8, 2014, and Japanese Patent Application No. 2014-251933, filed on Dec. 12, 2014, the contents of which are incorporated herein by reference in their entirety.

BACKGROUND ART

RE-123-based oxide superconductors ($REBa_2Cu_3O_{7-x}$: RE represents rare earth elements including Y) exhibit superconductivity at the temperature of liquid nitrogen and have low current losses and are thus extremely promising materials in a practical sense. There is demand for these oxide superconductors to be processed into wires and be used as conductors or electromagnetic coils which is used in power supply or the like.

As an example of a structure in which this oxide superconducting wire is used, an oxide superconducting wire obtained by using a substrate made of a metal having a high mechanical strength, forming an intermediate layer having a favorable crystal orientation on the surface of the substrate using an ion-beam-assisted deposition method (IBAD method), forming an oxide superconducting layer on the surface of the intermediate layer using a film-forming method, and forming a metal-stabilizing layer made of a highly conductive material such as Ag on the surface of the oxide superconducting layer is known.

When a magnetic field component varying in a direction perpendicular to the surface over time is applied to an oxide superconducting wire, loop-like shielding currents flow in the surface of an oxide superconducting layer. The shielding currents cause magnetization losses in which the shielding currents are discharged as heat. Therefore, when large shielding currents are generated, there has been a problem in that the energy efficiency of the oxide superconducting wire decreases. In addition, when the oxide superconducting wire is processed into a coil shape and is supplied with currents so as to generate a magnetic field, the magnetic field is shielded due to the shielding currents, and there has been a problem in that a magnetic field cannot be generated as designed.

In addition, the shielding currents attenuate over time. Therefore, in a case in which an oxide superconducting wire is applied to a superconducting device generating a magnetostatic field which does not change over time, there has been a problem in that the magnetic field changes over time due to the attenuation of the shielding currents.

The shielding currents and the degrees of magnetization losses caused by the shielding currents depend on the width of the oxide superconducting layer. Therefore, it is known that, when an oxide superconducting wire is divided into a plurality of wires, and the wires are thinned (formed into multiple filaments), the shielding currents and the magnetization losses can be reduced.

In addition, it is known that, in a case in which an oxide superconducting wire is used in a device to which an alternating-current is applied such as a motor or a transformer, when the oxide superconducting wire is divided into a plurality of wires, and the wires are thinned, it is possible to reduce alternating-current losses caused by a variable magnetic field based on the flowing alternating-current.

As an example of a method of dividing the oxide superconducting wire into a plurality of wires and thinning the wires, a method in which grooves are formed by radiating laser light rays in the longitudinal direction of the wire from the upper surface thereof and an oxide superconducting layer is divided (for example, Patent Documents 1 and 2) or the like is known.

PRIOR ART DOCUMENTS

Patent Documents

[Patent Document 1] Japanese Unexamined Patent Application, First Publication No. 2007-141688
[Patent Document 2] Japanese Unexamined Patent Application, First Publication No. 2011-96566

SUMMARY OF INVENTION

Problems to be Solved by the Invention

However, in the above-described dividing and thinning method, a part of the oxide superconducting wire is directly processed, and thus there has been a concern that parts of an oxide superconductor other than the grooves may be damaged and superconducting characteristics may deteriorate.

The invention has been made in consideration of the above-described problem, and an object of the invention is to provide an oxide superconducting wire reducing shielding currents, magnetization losses caused by the shielding currents, and alternating-current losses while degradation in the characteristics of the oxide superconducting wire is suppressed.

Means for Solving the Problems

In order to solve the above-described problem, an oxide superconducting wire according to a first aspect of the invention includes: a substrate; an intermediate layer laminated on a main surface of the substrate, the intermediate layer having one or more layers having an orientation, the intermediate layer having one or more non-orientation regions extending in a longitudinal direction of the wire; and an oxide superconducting layer laminated on the intermediate layer, the oxide superconducting layer having a crystal orientation controlled by the intermediate layer, the oxide superconducting layer having non-orientation regions located on the non-orientation regions in the intermediate layer.

According to this constitution, the intermediate layer includes the non-orientation regions, and thus the orientations in the laminated portions of the oxide superconducting layer laminated on the non-orientation regions are disarrayed, the non-orientation regions are formed in the oxide superconducting layer, and the laminated portions do not have superconducting characteristics. Therefore, the oxide superconducting layer is divided by the non-orientation regions, the oxide superconducting wire is, substantially, divided into two or more wires (formed into multiple filaments), and the oxide superconducting wire is thinned, thereby reducing alternating-current losses. Furthermore, shielding currents and magnetization losses are reduced.

In addition, in the above-described oxide superconducting wire, direct processing is not required after the lamination of the oxide superconducting layer, and thus there are no concerns that the oxide superconducting layer may be damaged and deteriorated.

The oxide superconducting wire according to the first aspect of the invention further includes orientation inhibition regions provided on the main surface of the substrate or a main surface of any layer of layers constituting the intermediate layer, wherein the orientation inhibition regions may be regions that inhibit crystal orientations in layers laminated on the orientation inhibition regions and form the non-orientation regions.

According to this constitution, when the orientation inhibition regions are formed, it is possible to form non-orientation regions on layers above the orientation inhibition regions. Therefore, it is not necessary to carry out direct processing after the lamination of the oxide superconducting layer, and there are no cases in which superconducting characteristics deteriorate in regions other than the non-orientation regions in the oxide superconducting wire.

In the oxide superconducting wire according to the first aspect of the invention, the orientation inhibition regions may be recessed grooves formed on the main surface of the substrate or the main surface of any layer of the layers constituting the intermediate layer.

According to this constitution, when the recessed grooves are formed in the substrate or the intermediate layer, it is possible to easily divide the oxide superconducting wire into a plurality of wires and thin the oxide superconducting wire.

In the oxide superconducting wire according to the first aspect of the invention, the intermediate layer may have an orientation layer and a cap layer laminated on the orientation layer, the oxide superconducting layer may be laminated on the cap layer, and the recessed grooves may be covered with the cap layer.

According to this constitution, when the recessed grooves are covered with the cap layer, it is possible to suppress the diffusion of a metallic material forming the substrate into the oxide superconducting layer using the cap layer. Therefore, it is possible to suppress deterioration in the characteristics of the oxide superconducting layer.

In the oxide superconducting wire according to the first aspect of the invention, the orientation inhibition regions may be protruding stripe portions formed on the main surface of the substrate or the main surface of any layer of the layers constituting the intermediate layer.

According to this constitution, when the protruding stripe portions are formed in the substrate or the intermediate layer, it is possible to easily divide the oxide superconducting wire into a plurality of wires and thin the oxide superconducting wire.

In the oxide superconducting wire according to the first aspect of the invention, the orientation inhibition regions may be rough surface portions formed on the main surface of the substrate or the main surface of any layer of the layers constituting the intermediate layer, and the rough surface portions may be regions having a relatively greater arithmetic average roughness Ra than portions in which the rough surface portions are not formed.

According to this constitution, when the rough surface portions are formed in the substrate or the intermediate layer, it is possible to easily divide the oxide superconducting wire into a plurality of wires and thin the oxide superconducting wire.

In the oxide superconducting wire according to the first aspect of the invention, the arithmetic average roughness Ra of the rough surface portions may be 5 nm to 1000 nm.

According to this constitution, it is possible to easily and reliably form the non-orientation regions in the oxide superconducting layer.

In order to solve the above-described problem, a method of manufacturing an oxide superconducting wire according to a second aspect of the invention, includes: preparing a substrate having a main surface; forming one or more orientation inhibition regions in a longitudinal direction of the wire on the main surface of the substrate; laminating an intermediate layer formed of one or more layers on the main surface of the substrate and the orientation inhibition regions after the orientation inhibition regions are formed; laminating an oxide superconducting layer having crystal orientations controlled by the intermediate layer on the intermediate layer; forming non-orientation regions in the oxide superconducting layer located on the orientation inhibition regions; and forming the oxide superconducting wire into multiple filaments.

In order to solve the above-described problem, in a method of manufacturing an oxide superconducting wire according to a third aspect of the invention, includes: preparing a substrate having a main surface; laminating an intermediate layer formed of one or more layers on the main surface of the substrate; after any layer of the layers constituting the intermediate layer is laminated, forming one or more orientation inhibition regions in a longitudinal direction of the wire on the main surface of the laminated layer; laminating an oxide superconducting layer having crystal orientations controlled by the intermediate layer on the intermediate layer and the orientation inhibition regions; forming non-orientation regions in the oxide superconducting layer located on the orientation inhibition regions; and forming the oxide superconducting wire into multiple filaments.

According to this constitution, when orientation inhibition is formed in the substrate or on the main surface of any layer of the layers constituting the intermediate layer, it is possible to form the non-orientation regions in the oxide superconducting layer. Therefore, it is possible to provide an oxide superconducting wire (formed into multiple filaments) in which the oxide superconducting layer is divided into a plurality of pieces by the non-orientation regions and is thinned. The oxide superconducting layer is not directly processed after being laminated, and there are no cases in which superconducting characteristics deteriorate in regions other than the orientation regions in the oxide superconducting layer.

In the method of manufacturing an oxide superconducting wire according to the second aspect or the third aspect of the invention, the orientation inhibition regions may be recessed grooves, and the recessed grooves may be formed on the main surface when forming the orientation inhibition regions.

According to this constitution, when the recessed grooves are formed in the substrate or the intermediate layer, it is possible to easily divide the oxide superconducting wire into a plurality of wires and thin the oxide superconducting wire.

In the method of manufacturing an oxide superconducting wire according to the second aspect or the third aspect of the invention, when forming the orientation inhibition regions, the recessed grooves may be formed by pressing a processing tool onto the main surface and moving the wire in the longitudinal direction.

According to this constitution, linear recessed grooves having a stable depth and a stable width can be easily formed by moving the wire while pressing the tool onto the main surface. The linear recessed grooves function as orientation inhibition regions, and thus it is possible to easily thin the oxide superconducting wire by dividing the oxide superconducting layer by the non-orientation regions and dividing the oxide superconducting wire into a plurality of wires. In a case in which the recessed grooves are formed in the intermediate layer, the orientations of the intermediate layers are disarrayed in the recessed grooves, thereby forming the non-orientation regions.

In the method of manufacturing an oxide superconducting wire according to the second aspect or the third aspect of the invention, the orientation inhibition regions may be protruding stripe portions, and the protruding stripe portions may be formed on the main surface when forming the orientation inhibition regions.

According to this constitution, when the protruding stripe portions are formed in the substrate or the intermediate layer, it is possible to easily divide the oxide superconducting wire into a plurality of wires and thin the oxide superconducting wire.

In the method of manufacturing an oxide superconducting wire according to the second aspect or the third aspect of the invention, when forming the orientation inhibition regions, the protruding stripe portions may be formed by attaching a fixing agent to the main surface.

According to this constitution, the protruding stripe portions can be easily formed by attaching the fixing agent to the main surface. The protruding stripe portions function as orientation inhibition regions, and thus it is possible to easily divide the oxide superconducting wire into a plurality of wires and thin the oxide superconducting wire.

In the method of manufacturing an oxide superconducting wire according to the second aspect or the third aspect of the invention, the orientation inhibition regions may be rough surface portions, and the rough surface portions may be formed on the main surface when forming the orientation inhibition regions.

According to this constitution, when the rough surface portions are formed in the substrate or the intermediate layer, it is possible to easily divide the oxide superconducting wire into a plurality of wires and thin the oxide superconducting wire.

In the method of manufacturing an oxide superconducting wire according to the second aspect or the third aspect of the invention, when forming the orientation inhibition regions, the rough surface portions may be formed by radiating laser light rays on the main surface.

According to this constitution, the rough surface portions can be easily formed by radiating laser light rays on the main surface. The rough surface portions function as orientation inhibition regions, and thus it is possible to easily divide the oxide superconducting wire into a plurality of wires and thin the oxide superconducting wire. In a case in which the rough surface portions are formed in the intermediate layer, the orientations of the intermediate layer are disarrayed in the rough surface portions, thereby forming the non-orientation regions.

Advantageous Effects of Invention

The oxide superconducting wires according to the above-described aspects of the invention have the non-orientation regions in the intermediate layer, and thus the orientations in the laminated portions of the oxide superconducting layer laminated on the non-orientation regions are disarrayed, and the laminated portions do not have superconducting characteristics. Therefore, the oxide superconducting wires are, substantially, divided into a plurality of wires, the oxide superconducting wires are thinned, and shielding currents, magnetization losses caused by the shielding currents, and alternating-current losses are reduced.

In addition, the above-described oxide superconducting wires do not need to be directly processed after the lamination of the oxide superconducting layer, and thus there are no concerns that the oxide superconducting layer may be damaged and deteriorated.

EMBODIMENTS FOR CARRYING OUT THE INVENTION

Hereinafter, embodiments of the oxide superconducting wire of the invention will be described with reference to drawings. In the respective drawings used in the following description, individual members are enlarged so as to be recognizable, and thus the reduced scales of the individual members are appropriately changed. The dimensions and ratios of individual components are appropriately changed from those of actual components. In addition, the invention is not limited to the following embodiments.

First Embodiment

First, a first embodiment will be described.

Figure 1A:
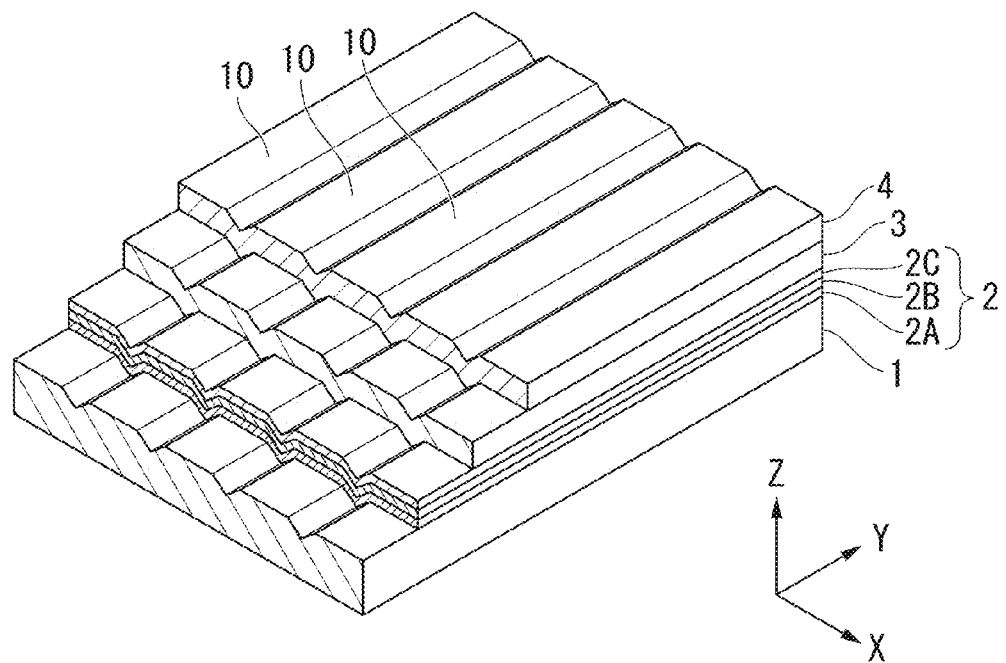
FIG. 1A is a sectional perspective view schematically showing an oxide superconducting wire according to a first embodiment.
Figure 1B:
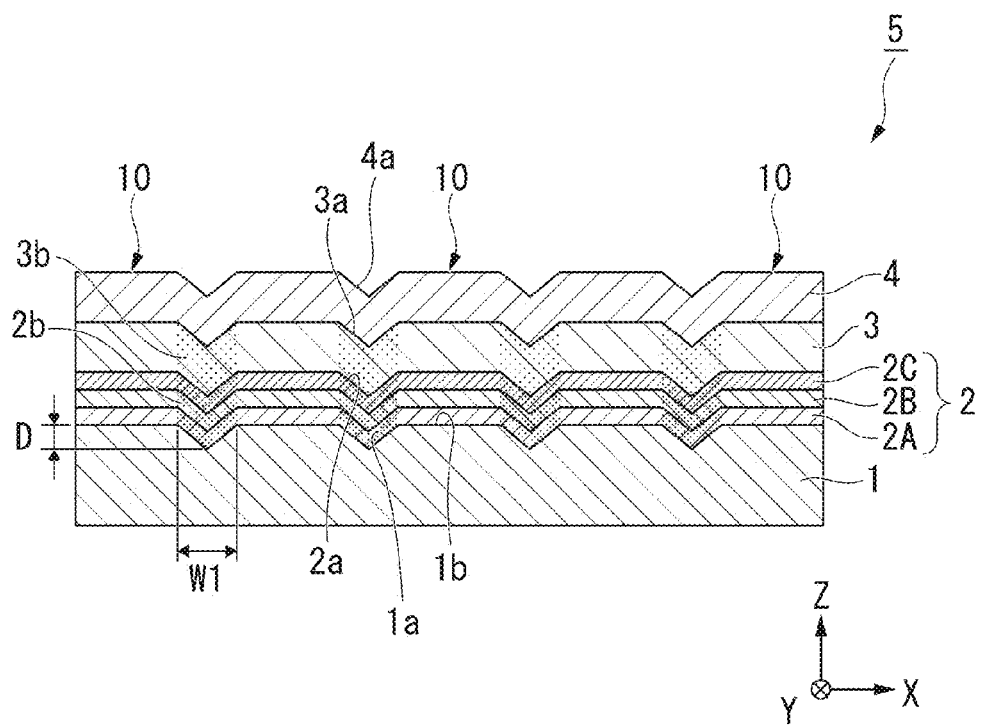
FIG. 1B is a sectional view schematically showing the oxide superconducting wire according to the first embodiment.

FIG. 1A is a sectional perspective view schematically showing an oxide superconducting wire 5 according to the present embodiment. FIG. 1B is a sectional view schematically showing the oxide superconducting wire 5 according to the present embodiment.

As shown in FIGS. 1A and 1B, the oxide superconducting wire 5 according to the present embodiment has an intermediate layer 2, an oxide superconducting layer 3, and a metal-stabilizing layer 4 laminated in this order on a substrate 1. In addition, non-orientation regions 2b and 3b are formed in the intermediate layer 2 and the oxide superconducting layer 3 of the oxide superconducting wire 5.

On a main surface 1b of the substrate 1, a plurality of first recessed grooves 1a disposed in parallel at intervals are formed. These first recessed grooves 1a function as orientation inhibition regions. Therefore, the orientations of the intermediate layer 2 and the oxide superconducting layer 3 formed on the first recessed groove 1a are inhibited, and the non-orientation regions 2b and 3b are formed in the intermediate layer 2 and the oxide superconducting layer 3 which are formed on the first recessed groove 1a.

Since the non-orientation regions 3b in the oxide superconducting layer 3 are not superconductive, the non-orientation regions serve as high-resistance regions when used and do not easily allow currents to flow. Therefore, the oxide superconducting layer 3 is divided by the non-orientation regions 3b and is thus, substantially, divided into two or more wires, and the oxide superconducting layer 3 is thinned. Therefore, the oxide superconducting wire 5 has a constitution of being divided into a plurality of parallel filaments 10 (multiple filaments) (a multiple-filament structure).

In the present specification, the non-orientation region refers to a region exhibiting no orientations in a layer including regions in which crystals exhibit orientations. In addition, the orientation inhibition region refers to a region inhibiting the crystal orientation of a layer laminated thereon. Particularly, the orientation inhibition region also inhibits the orientation of a layer laminated thereon through another layer.

Hereinafter, the constitutions of the respective portions forming the oxide superconducting wire 5 will be described in detail.

The type of the substrate 1 is not limited as long as the substrate 1 is a substrate that can be used as a substrate used to form superconducting wires. The substrate 1 is preferably formed of a metal having heat resistance. As the material of the substrate 1, among metals having heat resistance, an alloy is preferred, and a nickel (Ni) alloy or a copper (Cu) alloy is more preferred. Among these, as a commercially available product, HASTELLOY (trade name, manufactured by Haynes International, Inc.) is preferred, and all types of HASTELLOY B, C, G, N, W, or the like in which the amounts of components such as molybdenum (Mo), chromium (Cr), iron (Fe), and cobalt (Co) are different from each other can be used. In addition, as the substrate 1, an orientation substrate having aligned orientations of metallic crystals may be used.

In the present embodiment, the shape of the substrate 1 is a long tape shape, but may be, for example, a sheet shape. The thickness of the substrate 1 may be appropriately adjusted depending on the purpose and can be set to be in a range of 10 to 500 μm.

On a main surface 1b of the substrate 1, a plurality of first recessed grooves (orientation inhibition regions) 1a disposed in parallel at intervals are formed. The first recessed grooves 1a are V-shaped grooves formed on the main surface 1b of the substrate 1 and linearly extend in the longitudinal direction in the longitudinal direction of the substrate 1.

The depth D of the first recessed groove 1a is preferably set to 0.3 μm to 10 μm, and the width W1 thereof is preferably set to 10 μm to 500 μm.

When the depths D of the first recessed grooves 1a are set to 0.3 μm or greater, it is possible to form the non-orientation regions 2b in the intermediate layer 2 in portions formed on the first recessed grooves 1a. In addition, when the depths D of the first recessed grooves 1a are set to 10 μm or smaller, it is possible to maintain the strength of the substrate 1.

When the widths W1 of the first recessed grooves 1a are set to 10 μm or greater, it is possible to form the non-orientation regions 2b having a sufficient width. In addition, when the widths W1 of the first recessed grooves 1a are set to 500 μm or smaller, it is possible to narrow the widths of the non-orientation regions 3b in the oxide superconducting layer 3 and ensure the critical current density.

In the present embodiment, the first recessed grooves 1a are V-shaped grooves, but the shape of the recessed groove is not limited thereto. The shape of the groove is not limited as long as the shape of the groove allows the non-orientation regions 2b to be formed in the intermediate layer 2.

The intermediate layer 2 is formed on the main surface 1b of the substrate 1. As the structure of the intermediate layer 2, it is possible to apply a structure in which a foundation layer 2A, an orientation layer 2B, and a cap layer 2C are laminated in this order. The foundation layer 2A is formed of either or both a diffusion prevention layer and a bed layer.

The diffusion prevention layer has a function of suppressing the diffusion of part of the constituent elements of the substrate 1 and the mixing of the constituent elements into the oxide superconducting layer 3 as impurities in a case in which another layer (a layer different from the diffusion prevention layer) is formed above the diffusion prevention layer by means of a heating treatment and, consequently, the substrate 1 or another layer is subjected to a heat history. The diffusion prevention layer is constituted of $Si_3N_4$, $Al_2O_3$, GZO ($Gd_2Zr_2O_7$), or the like and is formed in a thickness of 10 nm to 400 nm.

The bed layer is provided in order to suppress reactions of the constituent elements in the interface between the substrate 1 and the oxide superconducting layer 3 and improve the orientation of a layer provided above the bed layer (on the upper surface of the bed layer). The bed layer is a layer used to reduce interface reactivity and obtaining the orientation of a film formed on the bed layer. The bed layer is made of $Y_2O_3$, $CeO_2$, $DY_2O_3$, $Er_2O_3$, $Eu_2O_3$, $Ho_2O_3$, $La_2O_3$, or the like, and the thickness of the bed layer is, for example, 10 nm to 100 nm.

The orientation layer 2B is provided in order to control the crystal orientation of the cap layer 2C or the oxide superconducting layer 3 formed on the orientation layer 2B. The orientation layer 2B is formed of a biaxially-oriented substance in order to control the crystal orientation of the cap layer 2C formed on the orientation layer 2B. Examples of a material of the orientation layer 2B include metal oxides such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$. The orientation layer 2B is preferably formed using an ion-beam-assisted deposition (IBAD) method.

The cap layer 2C is provided in order to control the crystal orientation of the oxide superconducting layer 3 to be as strong as or stronger than that of the orientation layer 2B. The cap layer 2C is formed of a material that can be formed into a film on the surface of the orientation layer 2B and allows crystal grains to be self-oriented in an in-plane direction. Specific examples of a material of the cap layer 2 include $CeO_2$, $Y_2O_3$, $Al_2O_3$, $Gd_2O_3$, $ZrO_2$, YSZ, $Ho_2O_3$, $Nd_2O_3$, $LaMnO_3$, or the like. The cap layer 2C can be formed so that the film thickness of the cap layer 2C falls in a range of 50 nm to 5000 nm.

In a case in which an orientation substrate is used as the substrate, the intermediate layer is constituted of a plurality of layers without using the IBAD method.

In the intermediate layer 2, particularly, the orientation layer 2B and the cap layer 2C are provided in order to control the orientation of the oxide superconducting layer 3 formed on the cap layer 2C. When the orientation layer 2B and the cap layer 2C have orientations, it is possible to control the orientation of the oxide superconducting layer 3 formed on the orientation layer 2B and the cap layer 2C. Therefore, in a case in which the orientation layer 2B and the cap layer 2C do not have any orientations, the oxide superconducting layer 3 formed on the orientation layer 2B and the cap layer 2C is also not capable of having orientations.

The orientation of the intermediate layer 2 relies on the surface properties of the main surface 1b of the substrate 1 on which the intermediate layer 2 is laminated. In a case in which the surface of the main surface 1b is inclined or the surface of the main surface 1b is coarse, the growth directions of crystals in the intermediate layer 2 are disarrayed, and the intermediate layer is not capable of obtaining a preferred orientation as a foundation of the oxide superconducting layer 3.

In the present embodiment, since the first recessed grooves 1a are formed on the main surface 1b of the substrate 1 and inclined surfaces are formed on surfaces on which a film is to be formed, the orientations in portions of the intermediate layer 2 which are formed on the first recessed grooves 1a are disarrayed. Therefore, in the intermediate layer 2, the non-orientation regions 2b corresponding to the first recessed grooves 1a are formed in portions formed on the first recessed grooves 1a in the substrate 1. In addition, in the intermediate layer 2 formed on the first recessed grooves 1a, the second recessed grooves 2a are formed on the surfaces of the first recessed grooves 1a as if the first recessed grooves 1a are transferred. The second recessed grooves 2a are, similar to the first recessed grooves 1a, V-shaped grooves.

In a case in which the thicknesses D of the first recessed grooves 1a in the substrate 1 are shallower than the thickness of the intermediate layer 2, there are cases in which the first recessed grooves 1a are buried by the lamination of the intermediate layer 2 and the second recessed grooves 2a are not formed on the surface of the intermediate layer 2. Even in this case, when the non-orientation regions 2b are formed on the surface of the intermediate layer 2, it is possible to form the non-orientation regions 3b in the oxide superconducting layer 3.

As a material forming the oxide superconducting layer 3, a well-known material as an oxide superconductor is selected, and specific examples thereof include $REBa_2Cu_3O_{7-X}$ (RE represents one or more of Sc, Y, La, Ce, Pr, Nd, Pm, Sm, Eu, Gd, Tb, Dy, Ho, Er, Tm, Yb, and Lu that are rare earth elements) which is called an RE-123-based oxide superconductor. Examples of the oxide superconducting layer 3 include Y123 ($YBa_2Cu_3O_{7-X}$), Gd123 ($GdBa_2Cu_3O_{7-x}$), or the like.

The thickness of the oxide superconducting layer 3 is approximately 0.5 μm to 5 μm and is preferably a uniform thickness.

In the oxide superconducting layer 3, portions formed on the non-orientation regions 2b in the intermediate layer 2 serve as the non-orientation regions 3b in which the orientations of crystals are disarrayed. In addition, in the non-orientation regions 3b, the third recessed grooves 3a are formed as if the second recessed grooves 2a in the intermediate layer 2 are transferred.

The orientation of the oxide superconducting layer 3 is controlled by the intermediate layer 2 (particularly, the orientation layer 2B and the cap layer 2C). Therefore, the portions formed on the non-orientation regions 2b in the intermediate layer 2 develop a superconducting state but do not have a sufficient crystal orientation.

Additionally, the linear second recessed grooves 2a which are V-shaped grooves are formed on the surfaces of the non-orientation regions 2b in the intermediate layer 2. The orientation of the oxide superconducting layer 3 relies not only on the orientation of the intermediate layer 2 but also on the surface properties of the intermediate layer 2. When the second recessed grooves 2a are formed on the non-orientation regions 2b in the intermediate layer 2 as described above, it becomes more difficult for crystals constituting the oxide superconducting layer 3 formed on the second recessed grooves 2a to be oriented. Particularly, even in a case in which the second recessed grooves 2a are not formed on the surface of the intermediate layer 2, as long as the non-orientation regions 2b are formed, the non-orientation regions 3b are formed in the oxide superconducting layer 3 that is formed on the intermediate layer. However, when the second recessed grooves 2a are formed, the non-orientations of the non-orientation regions 3b in the oxide superconducting layer 3 become significant.

This non-orientation region 3b has a disarrayed orientation and is thus not superconductive or has a significantly low critical current. Therefore, when currents are made to flow in the oxide superconducting wire 5 at an extremely low temperature, the currents do not easily flow in the non-orientation regions 3b, and the oxide superconducting layer 3 is substantially divided.

When the oxide superconducting layer 3 is partitioned in the width direction by the non-orientation regions 3b, the oxide superconducting layer 3 is divided by the non-orientation regions 3b and functions as a plurality of thinned superconducting wires (multiple filaments).

When the non-orientation regions 3b are formed so as to partition the oxide superconducting layer 3 in the width direction, the non-orientation region may not be formed throughout the entire portion on each second recessed groove 2a. That is, as long as the non-orientation region 3b is capable of inhibiting currents between parts of the highly-oriented oxide superconducting layer 3 which are adjacent to each other with the non-orientation region 3b sandwiched therebetween, the width of the non-orientation region may be partially wide or narrow.

The metal-stabilizing layer (protective layer) 4 is formed of a material having favorable conductivity such as Ag or an Ag alloy. The metal-stabilizing layer 4 is formed as a layer having a lower contact resistance than the oxide superconducting layer 3 and having a favorable affinity to the oxide superconducting layer 3. The metal-stabilizing layer 4 is laminated using a film-forming method such as a sputtering method, and the thickness of the metal-stabilizing layer 4 is set to approximately 1 μm to 30 μm.

Fourth recessed grooves 4a are formed on the surface of the metal-stabilizing layer 4 as if the third recessed grooves 3a in the oxide superconducting layer 3 are transferred.

As the metal-stabilizing layer 4, a constitution in which metal tape or a plated layer is laminated on a layer (protective layer) of Ag or an Al alloy may be employed. Specifically, a constitution in which a layer (protective layer) of Ag or an Ag alloy is laminated on the oxide superconducting layer and then, furthermore, metal tape or a plated layer is laminated on the protective layer may be employed.

Metal tape may be laminated on the metal-stabilizing layer 4 or around the oxide superconducting wire 5 through a solder layer. In this case, as the metal tape, it is possible to use a relatively inexpensive conductive metallic material such as copper, a copper alloy such as a Cu—Zn alloy or a Cu—Ni alloy, aluminum, an aluminum alloy, or stainless steel.

The laminated metal tape functions as a bypass for commutating currents in the metal-stabilizing layer 4 and the oxide superconducting layer 3 when the oxide superconducting layer 3 is transited from a superconducting state to a normal conduction state. The thickness of the metal tape can be set to, for example, 10 μm to 300 μm. Even in a case in which a plated layer such as copper is formed around the oxide superconducting wire 5, the same function as in a case in which the above-described metal tape is used can be obtained. The constitution of the metal-stabilizing layer is applicable to other embodiments.

The oxide superconducting wire 5 may be, furthermore, fully covered with an insulating coating layer (not shown). When the oxide superconducting wire 5 is coated with a coating layer, the entire oxide superconducting wire 5 is protected, and the oxide superconducting wire 5 having stable performance can be obtained.

The coating layer is preferably formed of, for example, well-known materials such as a variety of resins or oxides which are generally used in the insulating coating of the oxide superconducting wire or the like.

Specific examples of the resins include polyimide resins, polyamide resins, epoxy resins, acrylic resins, phenolic resins, melamine resins, polyester resins, silicon resins, silicon resins, alkyd resins, vinyl resins, or the like. In addition, ultraviolet-curable resins are preferred.

Examples of the oxides include $CeO_2$, $Y_2O_3$, $Gd_2Zr_2O_7$, $Gd_2O_3$, $ZrO_2$—$Y_2O_3$ (YSZ), $Zr_2O_3$, $Ho_2O_3$, or the like.

The thickness of a coating by the coating layer is not particularly limited and may be appropriately adjusted depending on the coating subject portions or the like.

The coating layer may be formed using well-known methods depending on the material quality of the coating layer, and, for example, the coating layer may be formed by applying raw materials on the oxide superconducting wire 5 and curing the coated film. In addition, in a case in which a sheet-like coating can be procured, the sheet-like coating may be used and laminated on the oxide superconducting wire 5.

In the oxide superconducting layer 3 in the oxide superconducting wire 5, the plurality of the non-orientation regions 3b extending in parallel at intervals are formed. The oxide superconducting layer 3 is divided by the non-orientation regions 3b, and the oxide superconducting wire 5 is divided by the multiple filaments 10. The respective filaments 10 are not mechanically divided, but the non-orientation regions 3b are formed in the oxide superconducting layer 3, and thus currents flow in the respective filaments 10 in a superconducting state. Therefore, the oxide superconducting wire 5 has a constitution in which a plurality of superconducting wires (the filaments 10) are individually disposed in parallel.

When the number of the first recessed grooves 1a (that is, the number of the non-orientation regions 2b and 3b formed thereon) is increased, the number of the filaments 10 formed in the oxide superconducting wire 5 increases, and, as the number of the filaments increases, alternating-current losses are reduced. In addition, when the number of the filaments 10 is increased, shielding currents and magnetization losses caused by the shielding currents are reduced. This is because, when the oxide superconducting layer 3 is divided in the width direction, the migration amount of magnetic fluxes intruding into the respective filaments 10 decreases in accordance with the number of the divided filaments. Therefore, an increased number of the linearly-formed first recessed grooves 1a are preferably formed. However, when the widths of the filaments 10 are excessively thinned, the proportion of the non-orientation regions 3b in the oxide superconducting layer 3 increases, and the critical current density becomes low. In addition, in this case, there is a concern that, in the oxide superconducting layer 3, the non-orientation regions 3b adjacent to each other may be connected to each other and currents may not flow in the longitudinal direction.

Therefore, the widths of the filaments 10 which are divided by the first recessed grooves 1a in the substrate 1 and the non-orientation regions 2b and 3b formed on the first recessed grooves 1a are preferably set to 100 μm or greater.

Particularly, the widths of the respective filaments 10 may be identical to or different from each other; however, generally, the widths thereof are set to be identical to each other.

When the oxide superconducting layer 3 is divided by the non-orientation regions 3b and is thus thinned as described above, shielding currents in the oxide superconducting wire 5, magnetization losses caused by the shielding currents, and alternating-current losses are reduced.

The oxide superconducting wire 5 is divided into the multiple filaments 10 by forming the plurality of the linear non-orientation regions 3b in the oxide superconducting wire 5. The resistance between the filaments per centimeter in the oxide superconducting layer 3 reaches 1 Ω/cm or higher.

Particularly, as another embodiment, a constitution in which the metal-stabilizing layer 4 is divided along the third recessed grooves 3a may be employed. The above-described metal-stabilizing layer 4 can be formed by, for example, forming a mask on the metal-stabilizing layer 4 and removing the mask in the portions corresponding to the third recessed grooves 3a by means of etching. In such a case, it is possible to remove portions of the metal-stabilizing layer 4 which correspond to the third recessed grooves 3a and laminate the metal-stabilizing layer 4 only on the highly-oriented portions of the oxide superconducting layer 3.

In addition, even in a case in which metal tape or a plated layer is laminated on the metal-stabilizing layer 4, the metal tape or the plated layer in portions located on the non-orientation regions 3b in the oxide superconducting layer 3 may be removed by means of etching or the like.

In the above-described embodiment, the respective filaments 10 are not electrically connected to each other, and thus it is possible to more effectively reduce shielding currents, magnetization losses caused by the shielding currents, and alternating-current losses.

Next, an example of a method of manufacturing the oxide superconducting wire 5 according to the present embodiment will be described.

The method of manufacturing the oxide superconducting wire 5 according to the present embodiment includes a step of forming the first recessed grooves 1a in the substrate 1. Hereinafter, a specific manufacturing method will be described.

First, a tape-like substrate 1 is prepared, and the main surface 1b of the substrate 1 is polished, thereby setting the arithmetic average roughness Ra of the main surface 1b to 3 nm to 4 nm. Furthermore, the main surface 1b of the substrate is degreased and washed with acetone. After the following steps, the main surface 1b of the substrate 1 is prepared so as to easily provide an orientation of the intermediate layer 2 when the intermediate layer 2 is laminated on the substrate.

Next, the linear first recessed grooves 1a are formed on the main surface 1b of the tape-like substrate 1 (one or more orientation inhibition regions are formed).

Figure 2:
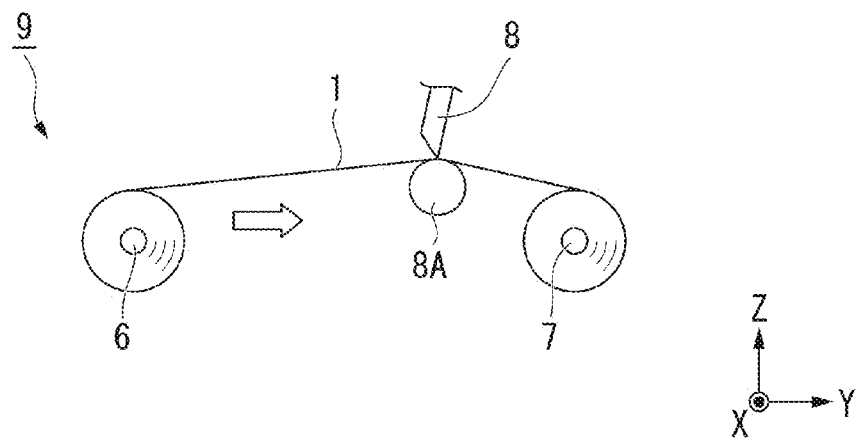
FIG. 2 is a schematic view showing a first recessed groove-processing device according to a method of manufacturing the oxide superconducting wire according to the first embodiment.

FIG. 2 is a schematic view showing a first recessed groove-processing device 9 that is used to form the first recessed grooves 1a on the main surface 1b of the substrate 1 in the present embodiment.

The first recessed groove-processing device 9 is schematically constituted of a delivery reel 6, a coiling reel 7, a relay reel 8A disposed between the delivery reel 6 and the coiling reel 7, and a processing tool 8.

The substrate 1 is coiled around the delivery reel 6. A transportation device such as a motor (not shown) is attached to the coiling reel 7. When the substrate 1 is coiled around the coiling reel 7, and the transportation device is operated, it is possible to deliver the substrate 1 from the delivery reel 6 and coil the substrate 1 using the coiling reel 7 through the relay reel 8A.

The processing tool 8 is a blade used to carry out a metal processing in which the tip of the processing tool 8 faces the relay reel 8A. The tip of the processing tool 8 has, for example, a V-like sharp shape.

When the tip of the processing tool 8 is pressed onto the substrate 1 being transported along the outer circumference of the relay reel 8A while coiling the substrate 1 around the coiling reel 7, it is possible to form linear grooves (the first recessed grooves 1a, refer to FIGS. 1A and 1B) in the substrate 1.

Particularly, when a plurality of the processing tools 8 are disposed in parallel in the depth direction (X-axis direction) of FIG. 2, it is possible to form a plurality of the parallel first recessed grooves 1a in the longitudinal direction of the tape-like substrate 1.

The intermediate layer 2 is laminated on the oxide superconducting wire 5 having the first recessed grooves 1a formed therein as described above using well-known methods of the related art (after the lamination step and the formation of the orientation inhibition regions, the intermediate layer formed of one or more layers is laminated on the main surface and the orientation inhibition regions of the substrate). Furthermore, the oxide superconducting layer 3 is laminated on the main surface of the intermediate layer 2 (the oxide superconducting layer having crystal orientations controlled by the intermediate layer is laminated on the intermediate layer). In a film-forming step of the intermediate layer 2, the non-orientation regions 2b having no orientations are formed on the first recessed grooves 1a. Similarly, in a film-forming step of the oxide superconducting layer 3, the non-orientation regions 3b of the oxide superconducting layer 3 are formed on the non-orientation regions 2b in the intermediate layer 2 (the non-orientation regions are formed in the oxide superconducting layer located above the orientation inhibition regions).

Furthermore, the metal-stabilizing layer 4 is laminated thereon, whereby it is possible to produce the oxide superconducting wire 5 which is divided into the multiple filaments 10 by the non-orientation regions 3b and is thinned.

In the method of manufacturing the oxide superconducting wire 5 according to the present embodiment, mechanical processing using laser or the like or chemical processing by means of etching is not carried out on the oxide superconducting layer 3 after the lamination of the oxide superconducting layer 3. Therefore, there are no cases in which superconducting characteristics deteriorate in regions other than the orientation regions in the oxide superconducting layer 3. In addition, for the same reason, there are no cases in which the peeling resistance (peeling strengths) of the respective layers deteriorates.

Second Embodiment

Next, a second embodiment will be described.

Figure 3:
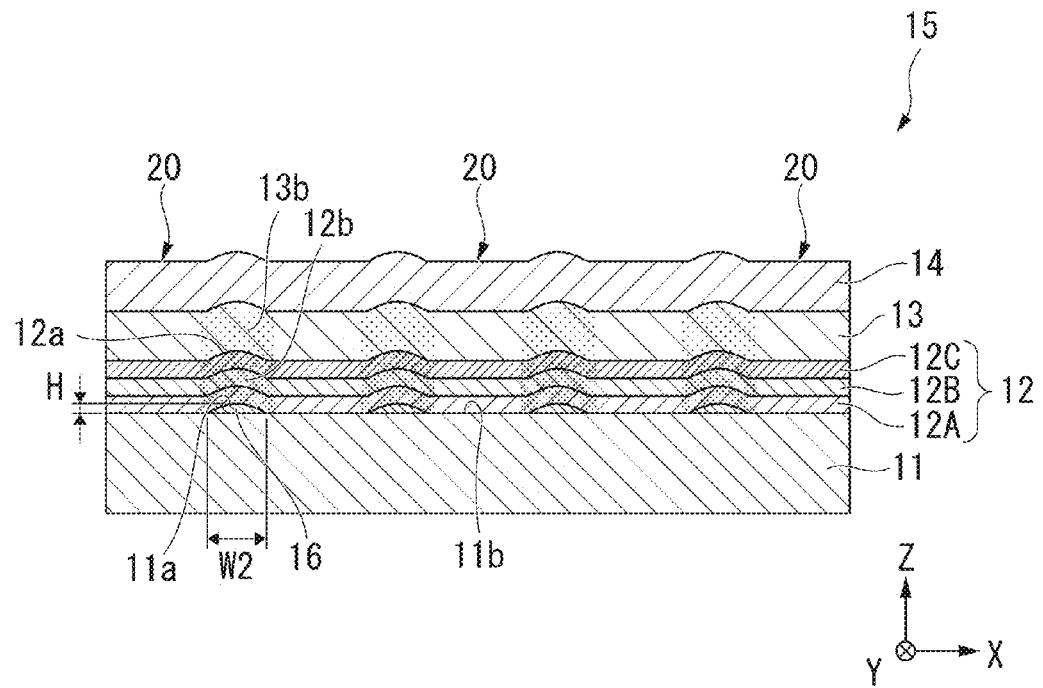
FIG. 3 is a sectional view schematically showing an oxide superconducting wire according to a second embodiment.

FIG. 3 is a sectional view schematically showing an oxide superconducting wire 15 according to the second embodiment. Hereinafter, the oxide superconducting wire 15 will be described with reference to FIG. 3.

The oxide superconducting wire 15 according to the second embodiment is different from the oxide superconducting wire 5 according to the first embodiment in terms of the constitution of the orientation inhibition regions.

As shown in FIG. 3, the oxide superconducting wire 15 has an intermediate layer 12 (a foundation layer 12A, an orientation layer 12B, and a cap layer 12C), an oxide superconducting layer 13, and a metal-stabilizing layer 14 laminated in this order on a substrate 11. In addition, non-orientation regions 12b and 13b are formed in the intermediate layer 12 and the oxide superconducting layer 13 of the oxide superconducting wire 15.

On a main surface 11b of the substrate 11, a plurality of first protruding stripe portions (orientation inhibition regions) 11a disposed in parallel at intervals are formed. The first protruding stripe portion 11a is a fixing agent 16 that is linearly attached to and solidified on the main surface 11b of the substrate 11. As the fixing agent 16, it is possible to use, for example, a heat-resistant adhesive capable of withstanding heat during formation of films or thermal treatments. In addition, the fixing agent 16 may be formed using materials such as heat-resistant ink that is solidified by means of drying.

The forms of the first protruding stripe portions 11a are not limited to protruding stripe portions formed by the attachment and solidification of the fixing agent 16, and protruding stripe portions having different forms may be formed. For example, the first protruding stripe portions 11a may be formed by processing the main surface 11b of the substrate 11 in a concavo-convex shape.

The heights H of the first protruding stripe portions 11a are preferably set to 0.3 μm to 10 μm, and the widths W2 thereof are preferably set to 10 μm to 500 μm.

When the heights H of the first protruding stripe portions 11a are set to 0.3 μm or greater, it is possible to form the non-orientation regions 12b in the intermediate layer 12 in portions formed on the first protruding stripe portions 11a. In addition, when the heights H of the first protruding stripe portions 11a are set to 10 μm or smaller, it is possible to reduce influences on the orientations of regions in the intermediate layer 12 in which crystals are supposed to be oriented due to the influences of the first protruding stripe portions 11a.

When the widths W2 of the first protruding stripe portions 11a are set to 10 μm or greater, it is possible to form the non-orientation regions 12b having a sufficient width. In addition, when the widths W2 of the first protruding stripe portions 11a are set to 500 μm or smaller, it is possible to narrow the widths of non-orientation regions 13b in the oxide superconducting layer 13 and ensure the critical current density.

In the intermediate layer 12, the non-orientation regions 12b are formed in portions formed on the first protruding stripe portions 11a. This is because the first protruding stripe portions 11a function as the orientation inhibition regions.

Since the fixing agent 16 is a foreign substance attached to the main surface 11b of the substrate 11, it becomes impossible for the intermediate layer 12 formed on the fixing agent 16 to be oriented in a predetermined direction. In addition, the orientation of the intermediate layer 12 relies on the surface properties of the main surface 11b of the substrate 11 on which the intermediate layer 12 is laminated. Since the first protruding stripe portions 11a made of the fixing agent 16 form unevenness, the orientation of the intermediate layer 12 is disarrayed, and the non-orientation regions 12b are formed in the intermediate layer 12.

In addition, in the intermediate layer 12 formed on the first protruding stripe portions 11a, second protruding stripe portions 12a are formed on the surfaces of the first protruding stripe portions 11a as if the first protruding stripe portions 11a are transferred. The second protruding stripe portions 12a are, similar to the first protruding stripe portions 11a, formed in a linearly swelling manner.

In the oxide superconducting layer 13, portions formed on the non-orientation regions 12b in the intermediate layer 12 serve as the non-orientation regions 13b having no orientations.

Since the orientation of the oxide superconducting layer 13 is controlled by the intermediate layer 12 (particularly, the orientation layer 12B and the cap layer 12C), the portions formed on the non-orientation regions 12b in the intermediate layer 12 are not capable of having orientations. Additionally, the linear second protruding stripe portions 12a are formed on the surfaces of the non-orientation regions 12b in the intermediate layer 12. The orientation of the oxide superconducting layer 13 relies not only on the orientation of the intermediate layer 12 but also on the surface properties of the intermediate layer 12. Therefore, it becomes more difficult for the oxide superconducting layer 13 formed on (particularly on the step portions of) the second protruding stripe portions 12a to be oriented.

In the oxide superconducting wire 15 according to the second embodiment, the oxide superconducting layer 13 is substantially divided by the non-orientation regions 13b. Therefore, the oxide superconducting wire 15 has a constitution in which the oxide superconducting wire is divided into multiple filaments 20 and the multiple filaments 20 are disposed in parallel.

When the oxide superconducting layer 13 is divided by the non-orientation regions 13b and the oxide superconducting layer 13 is thinned as described above, shielding currents in the oxide superconducting wire 15, magnetization losses caused by the shielding currents, and alternating-current losses are reduced.

Next, an example of a method of manufacturing the oxide superconducting wire 15 according to the present embodiment will be described.

First, similar to the manufacturing method according to the first embodiment, a tape-like substrate 11 is polished and, furthermore, is degreased and washed.

Next, the linear first protruding stripe portions 11a are formed on the main surface 11b of the tape-like substrate 11.

Figure 4:
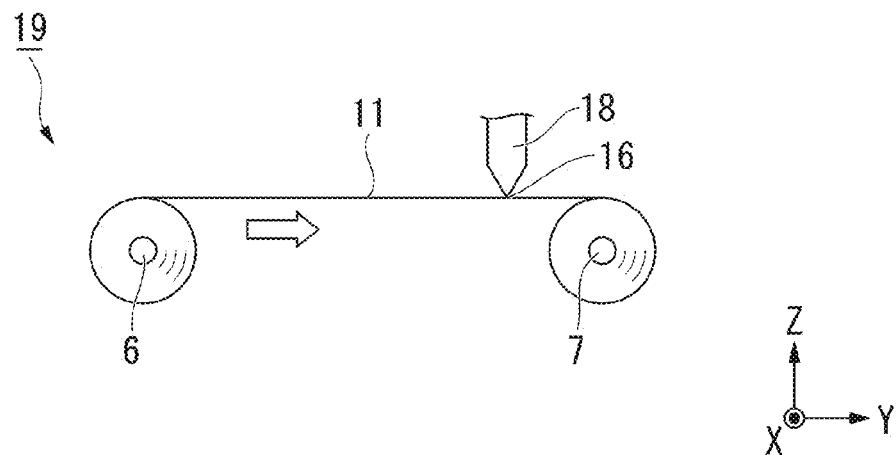
FIG. 4 is a schematic view showing a first protruding stripe portion-processing device according to a method of manufacturing the oxide superconducting wire according to the second embodiment.

FIG. 4 is a schematic view showing a first protruding stripe portion-processing device 19 that is used to form the first protruding stripe portions 11a on the main surface 11b of the substrate 11 in the present embodiment.

The first protruding stripe portion-processing device 19 is schematically constituted of the delivery reel 6, the coiling reel 7, and a coating section 18. In the first protruding stripe portion-processing device 19, the fixing agent 16 which serves as the first protruding stripe portions 11a is applied onto the substrate 11 using the coating section 18 while coiling the substrate 11 around the coiling reel 7. Therefore, it is possible to linearly form the first protruding stripe portions 11a.

As the constitution of the coating section 18, a constitution in which a nozzle is formed at the tip and the fixing agent is discharged using an ink jet method may be employed. In addition, a constitution in which a material is blown toward the substrate 11 in a spray shape using a spray method while masking portions not to be coated with the material may be employed.

The intermediate layer 12 is laminated on the oxide superconducting wire 15 having the first protruding stripe portions 11a formed therein using well-known methods of the related art (a lamination step). Furthermore, the oxide superconducting layer 13 is laminated on the main surface of the intermediate layer 12. Therefore, it is possible to produce the oxide superconducting wire 15 in which the non-orientation regions 12b are formed in the intermediate layer 12, the non-orientation regions 13b are formed in the oxide superconducting layer 13, and the oxide superconducting layer 13 is divided into the multiple filaments 20 by the non-orientation regions 13b and is thinned.

In the method of manufacturing the oxide superconducting wire 15 according to the present embodiment, mechanical processing using laser or the like or chemical processing by means of etching is not carried out on the oxide superconducting layer 13 after the lamination of the oxide superconducting layer 13. Therefore, there are no cases in which superconducting characteristics deteriorate in regions other than the orientation regions in the oxide superconducting layer 13. In addition, for the same reason, there are no cases in which the peeling resistance (peeling strengths) of the respective layers deteriorates.

Third Embodiment

Next, a third embodiment will be described.

Figure 5:
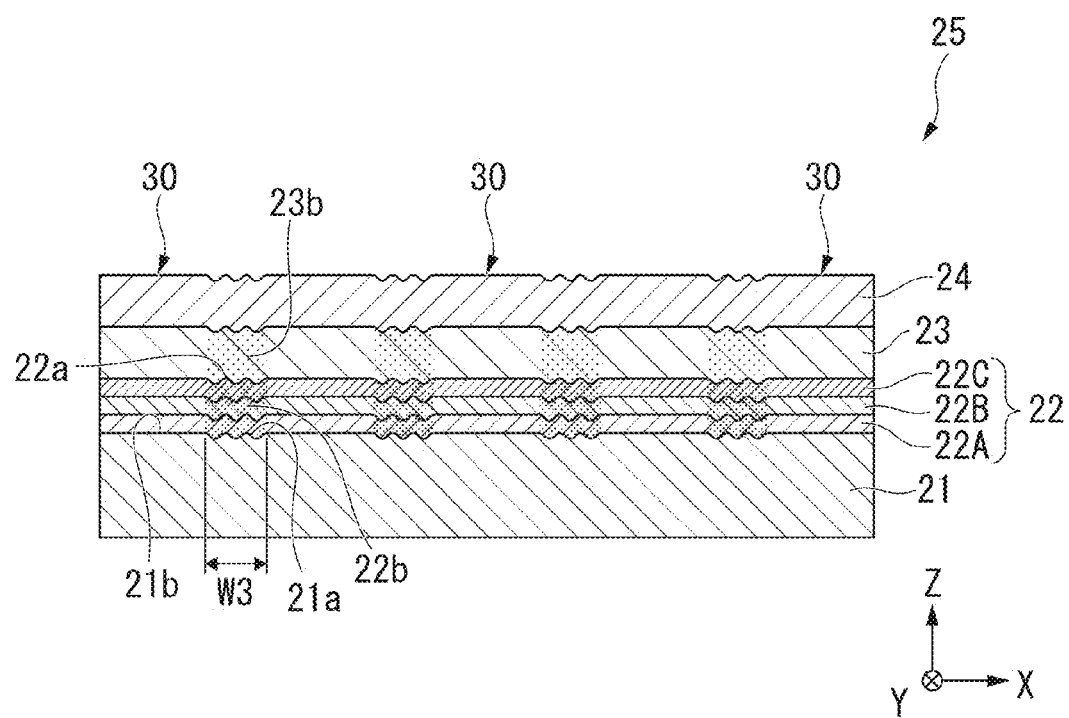
FIG. 5 is a sectional view schematically showing an oxide superconducting wire according to a third embodiment.

FIG. 5 is a sectional view schematically showing an oxide superconducting wire 25 according to the third embodiment. Hereinafter, the oxide superconducting wire 25 will be described with reference to FIG. 5.

The oxide superconducting wire 25 according to the third embodiment is different from the oxide superconducting wire 5 according to the first embodiment in terms of the constitution of the orientation inhibition regions.

As shown in FIG. 5, the oxide superconducting wire 25 has an intermediate layer 22 (a foundation layer 22A, an orientation layer 22B, and a cap layer 22C), an oxide superconducting layer 23, and a metal-stabilizing layer 24 laminated in this order on a substrate 21.

On a main surface 21b of the substrate 21, a plurality of first rough surface portions (orientation inhibition regions) 21a disposed in parallel at intervals are formed. The first rough surface portions 21a are regions having an arithmetic surface roughness Ra in a range of 5 nm to 1000 nm.

Particularly, the main surface of the substrate 21 other than the first rough surface portions 21a is polished so that the arithmetic surface roughness Ra reaches approximately 3 nm to 4 nm.

The widths W3 of the first rough surface portions 21a are preferably set to 10 μm to 500 μm. When the widths W3 of the first rough surface portions 21a are set to 10 μm or greater, it is possible to form non-orientation regions 22b in the intermediate layer 22 in portions formed on the first rough surface portions 21a. In addition, when the widths W3 of the first rough surface portions 21a are set to 500 μm or smaller, it is possible to narrow the widths of non-orientation regions 23b in the oxide superconducting layer 23 and ensure the critical current density.

The above-described first rough surface portions 21a can be formed by, for example, radiating laser light rays on the main surface 21b of the substrate 21.

As an example, in the first recessed groove-processing device 9 of FIG. 2, the processing tool 8 is switched to a laser radiation device, and laser light rays are radiated on the main surface 21b of the substrate 21 so as to melt and re-solidify the main surface 21b, whereby the first rough surface portions 21a can be formed on the main surface 21b.

Since the orientation of the intermediate layer 22 relies on the surface properties of the main surface 21b of the substrate 21 on which the intermediate layer 22 is laminated, the first rough surface portions 21a function as orientation inhibition regions. The non-orientation regions 22b are formed in the intermediate layer 22 formed on the first rough surface portions 21a.

In addition, second rough surface portions 22a are formed on the surfaces of the non-orientation regions 22b formed on the first rough surface portions 21a. The second rough surface portions 22a are, similar to the first rough surface portions 21a, linearly formed.

In the oxide superconducting layer 23, portions formed on the non-orientation regions 22b in the intermediate layer 22 serve as the non-orientation regions 23b having no orientations.

Since the orientation of the oxide superconducting layer 23 is controlled by the intermediate layer 22 (particularly, the orientation layer 22B and the cap layer 22C), the portions formed on the non-orientation regions 22b in the intermediate layer 22 are not capable of having orientations. Additionally, the second rough surface portions 22a are formed on the surfaces of the non-orientation regions 22b in the intermediate layer 22. Therefore, the oxide superconducting layer 23 formed on the non-orientation regions 22b serves as the non-orientation regions 23b.

In the oxide superconducting wire 25 according to the third embodiment, the oxide superconducting layer 23 is substantially divided by the non-orientation regions 23b. Therefore, the oxide superconducting wire 25 has a constitution in which the oxide superconducting wire is divided into multiple filaments 30 and the multiple filaments are disposed in parallel.

When the oxide superconducting layer 23 is divided by the non-orientation regions 23b and the oxide superconducting layer 23 is thinned as described above, shielding currents in the oxide superconducting wire 25, magnetization losses caused by the shielding currents, and alternating-current losses are reduced.

In the oxide superconducting wire 25 according to the present embodiment, mechanical processing using laser or the like or chemical processing by means of etching is not carried out after the lamination of the oxide superconducting layer 23. Therefore, there are no cases in which superconducting characteristics deteriorate in regions other than the orientation regions in the oxide superconducting layer 23. In addition, for the same reason, there are no cases in which the peeling resistance (peeling strengths) of the respective layers deteriorates.

Fourth Embodiment

Next, a fourth embodiment will be described.

Figure 6A:
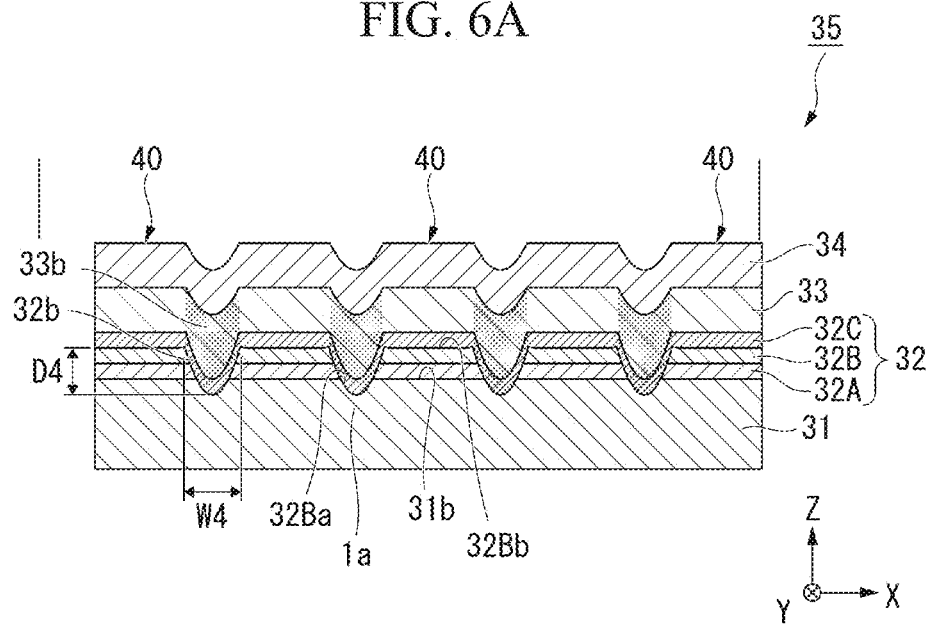
FIG. 6A is a sectional view schematically showing an oxide superconducting wire according to a fourth embodiment.
Figure 6B:
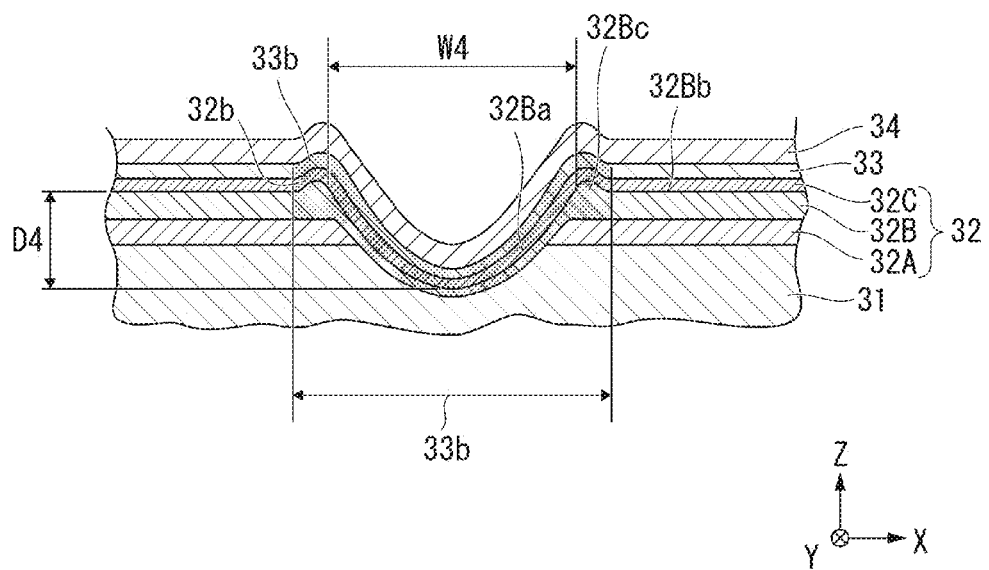
FIG. 6B is an enlarged sectional view schematically showing the oxide superconducting wire according to the fourth embodiment.

FIG. 6A is a sectional view schematically showing an oxide superconducting wire 35 according to the fourth embodiment. FIG. 6B is an enlarged view of a non-orientation region 33b in an oxide superconducting layer 33. Hereinafter, the oxide superconducting wire 35 will be described with reference to FIGS. 6A and 6B.

The oxide superconducting wire 35 according to the fourth embodiment is different from the oxide superconducting wire 5 according to the first embodiment in terms of the constitution of recessed grooves 32Ba.

As shown in FIGS. 6A and 6B, the oxide superconducting wire 35 has an intermediate layer 32 (a foundation layer 32A, an orientation layer 32B, and a cap layer 32C), an oxide superconducting layer 33, and a metal-stabilizing layer 34 laminated in this order on a main surface 31b of a substrate 31 (on the main surface of the substrate, the intermediate layer formed of one or more layers is laminated).

On a main surface 32Bb of the orientation layer 32B constituting the intermediate layer 32, the recessed grooves 32Ba reaching the inside of the intermediate layer or the substrate 31 are formed. The recessed grooves 32Ba extend in parallel at intervals. The recessed grooves 32Ba can be formed by moving the substrate 31 while pressing a processing tool onto the main surface 32Bb of the orientation layer 32B. The method of forming the recessed grooves 32Ba is identical to the method of forming the first recessed grooves 1a according to the first embodiment.

When the recessed grooves 32Ba are formed on the main surface 32Bb, the orientations in portions of the orientation layer 32B located right below the recessed grooves 32Ba and around the recessed grooves are disarrayed, and non-orientation regions are formed in the orientation layer 32B. As shown in FIG. 6B in an enlarged manner, at the edge portion of the recessed groove 32Ba, a bump portion 32Bc formed of the swollen orientation layer 32B is formed. When the recessed groove 32Ba is formed by pressing a processing tool onto the orientation layer 32B, some of the materials constituting the orientation layer 32B, the foundation layer 32A, and the substrate 31 which are pressed by the processing tool discharge outside the recessed groove 32Ba and swell, whereby the bump portion 32Bc is formed. Therefore, the orientation layer 32B does not have any orientations in the recessed groove 32Ba and the bump portion 32Bc. That is, regions in which the recessed groove 32Ba and the bump portion 32Bc are formed function as non-orientation regions. In addition, the recessed groove 32Ba and the bump portion 32Bc function as orientation inhibition regions that inhibit the orientation of the oxide superconducting layer 33 laminated on the recessed groove 32Ba and the bump portion 32Bc.

The widths W4 of the recessed grooves 32Ba are preferably set to 0.3 μm to 40 μm.

When the widths W4 of the recessed grooves 32Ba are set to 0.3 μm or greater, it is possible to reliably form non-orientation regions 33b in the oxide superconducting layer 33. In addition, when the widths W4 of the recessed grooves 32Ba are set to 40 μm or smaller, it is possible to narrow the widths of the non-orientation regions 33b in the oxide superconducting layer 33 and ensure the critical current density.

In the present specification, the recessed groove 32Ba refers to a region in which the orientation layer 32B is dented and thus becomes hollower than the thickness of the formed film. Therefore, the bump portion 32Bc is not included in the recessed groove 32Ba and forms a region formed on both sides of the recessed groove 32Ba. The width W4 of the recessed groove 32Ba is the width of the dented portion of the orientation layer 32B not including the bump portion 32Bc. The depth D4 of the recessed groove 32Ba refers to a distance in the thickness direction from the main surface 32Bb of the orientation layer 32B to the deepest portion of the recessed groove 32Ba.

The depths D4 of the recessed grooves 32Ba are preferably set to 0.3 μm to 10 μm.

When the depths D4 of the recessed grooves 32Ba are set to 0.3 μm or greater, it is possible to reliably form the non-orientation regions 33b in the oxide superconducting layer 33. In addition, when the depths D of the recessed groove 32Ba are set to 10 μm or smaller, it is possible to maintain the strength of the substrate 31.

Particularly, the sectional shape of the recessed grooves 32Ba is not limited to a substantially arc shape shown in FIGS. 6A and 6B and may be, for example, a V-shaped groove.

In the cap layer 32C, portions laminated on the recessed grooves 32Ba and the bump portions 32Bc of the orientation layer 32B do not have any orientations. The intermediate layer 32 has a non-orientation region 32b as a whole. In addition, the non-orientation region 32b refers to a region corresponding to the recessed groove 32Ba and 32Bc located at the edge portion of the recessed groove.

Since the orientation of the oxide superconducting layer 33 is controlled by the intermediate layer 32 (particularly, the orientation layer 32B and the cap layer 32C), portions formed on the non-orientation regions 32b in the intermediate layer 32 are not capable of having orientations. In the oxide superconducting layer 33, the portions formed on the non-orientation region 32b in the intermediate layer 32 serve as the non-orientation regions 33b having no orientations.

In the oxide superconducting wire 35 according to the fourth embodiment, the oxide superconducting layer 33 is substantially divided by the non-orientation region 33b. Therefore, the oxide superconducting wire 35 has a constitution in which the oxide superconducting wire is divided into multiple filaments 40 and the multiple filaments are disposed in parallel. When the oxide superconducting layer 33 is divided by the non-orientation regions 33b and the oxide superconducting layer 33 is thinned as described above, shielding currents in the oxide superconducting wire 35, magnetization losses caused by the shielding currents, and alternating-current losses are reduced.

In addition, in the oxide superconducting wire 35 according to the fourth embodiment, a part of the intermediate layer 32 that controls the orientation of the oxide superconducting layer 33 is directly processed, thereby forming the recessed grooves 32Ba. Therefore, it is possible to reliably form the non-orientation regions 32b using the intermediate layer 32.

In the oxide superconducting wire 35 according to the present embodiment, mechanical processing using laser or the like or chemical processing by means of etching is not carried out after the lamination of the oxide superconducting layer 33. Therefore, there are no cases in which superconducting characteristics deteriorate in regions other than the orientation regions in the oxide superconducting layer 33. In addition, for the same reason, there are no cases in which the peeling resistance (peeling strengths) of the respective layers deteriorates.

It is known that the ordinarily-laminated oxide superconducting layer 33 has weaker peeling resistance than layers located below the oxide superconducting layer 33. According to the oxide superconducting wire 35 according to the present embodiment, it is possible to enhance the peeling resistance of the oxide superconducting layer 33 and the intermediate layer 32 located below the oxide superconducting layer 33. That is, it is possible to suppress the peeling of the oxide superconducting layer 33. The recessed grooves 32Ba in the orientation layer 32B are formed by pressing a processing tool onto the main surface 32Bb of the orientation layer 32B, and fine protrusions and recesses caused by the processing are formed on the surface. In the cap layer 32C formed on the recessed grooves 32Ba having protrusions and recesses, fine protrusions and recesses are formed on the surface of the cap layer 32C in accordance with the fine protrusions and recesses formed on the orientation layer 32B. When the oxide superconducting layer 33 is formed on the cap layer 32C, the joint strength between the cap layer 32C and the oxide superconducting layer 33 becomes great due to an anchoring effect by the fine protrusions and recesses, and thus the peeling resistance of the oxide superconducting layer 33 is enhanced. Therefore, it is considered that the oxide superconducting layer 33 does not easily peel off.

In the present embodiment, a constitution in which the recessed groove 32Ba is formed in the orientation layer 32B in the intermediate layer 32 has been exemplified (after any layer of the plurality of the layers constituting the intermediate layer is laminated, one or more orientation inhibition regions are formed in the longitudinal direction of the wire on the main surface of the laminated layer). The recessed groove formed in the intermediate layer 32 may be formed on the main surface of any layer (laminated layer) of the plurality of the layers constituting the intermediate layer 32. In such a case, the recessed groove is capable of constituting the non-orientation region 32b in the intermediate layer 32. That is, the non-orientation region 32b in the intermediate layer 32 needs to be a region in which the orientation is disarrayed due to the recessed groove formed on any layer of the plurality of the layers constituting the intermediate layer 32.

In addition, as exemplified in the present embodiment, when the recessed grooves 32Ba are formed in the orientation layer 32B, the recessed grooves 32Ba are covered with the cap layer 32C formed on the orientation layer 32B. In a case in which the recessed grooves 32Ba are formed in the orientation layer 32B, the orientation layer 32B which is a portion located in the recessed groove 32Ba and the respective layers of the intermediate layer located below the above-described portion may become thin. Alternately, the respective layers in the intermediate layer are partially removed, and the substrate 31 is exposed, and thus it becomes easy for elements of a material constituting the substrate 31 to diffuse into the oxide superconducting layer 33. When the cap layer 32C is formed in the recessed grooves 32Ba, there are no cases in which the substrate 31 and the oxide superconducting layer 33 come into direct contact with each other in the region of the recessed groove 32Ba. In such a case, it is possible to suppress a metallic material constituting the substrate 31 diffusing into the oxide superconducting layer 33. Therefore, it is preferable to employ a structure in which the recessed grooves 32Ba are formed in the orientation layer 32B and the recessed grooves 32Ba are covered with the cap layer 32C.

Fifth Embodiment

Next, a fifth embodiment will be described.

Figure 7:
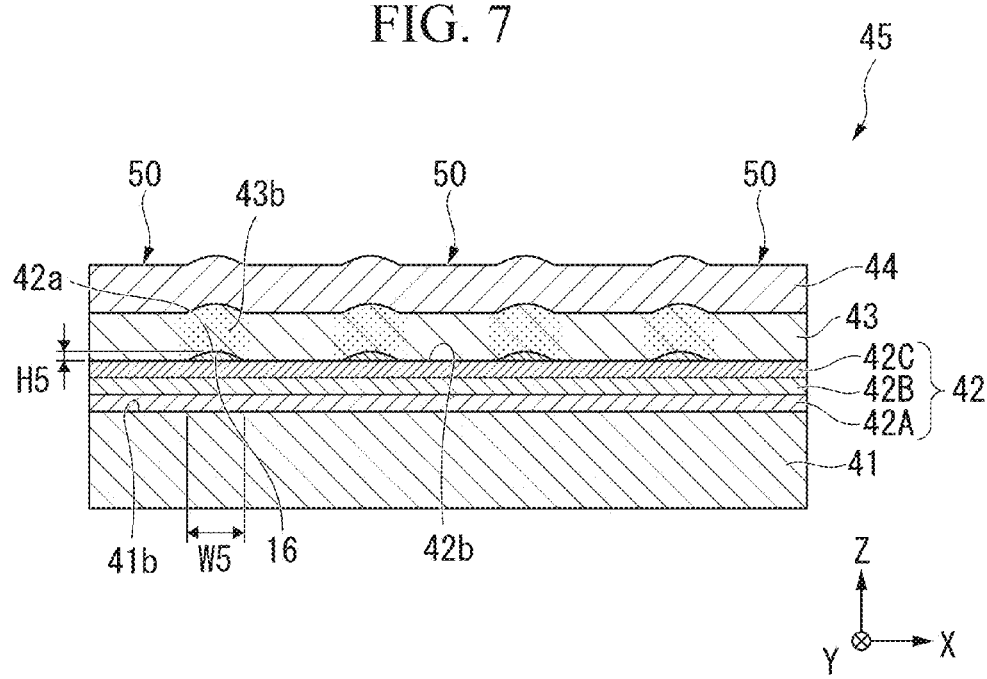
FIG. 7 is a sectional view schematically showing an oxide superconducting wire according to a fifth embodiment.

FIG. 7 is a sectional view schematically showing an oxide superconducting wire 45 according to the fifth embodiment. Hereinafter, the oxide superconducting wire 45 will be described with reference to FIG. 7.

The constitution of the oxide superconducting wire 45 according to the fifth embodiment is similar to the constitution of the oxide superconducting wire 15 according to the second embodiment. The oxide superconducting wire 45 according to the fifth embodiment is different from the oxide superconducting wire 15 according to the second embodiment in terms of the locations of protruding stripe portions 42a.

As shown in FIG. 7, the oxide superconducting wire 45 has an intermediate layer 42 (a foundation layer 42A, an orientation layer 42B, and a cap layer 42C), an oxide superconducting layer 43, and a metal-stabilizing layer 44 laminated in this order on a main surface 41b of a substrate 41. In addition, non-orientation regions 43b are formed in the oxide superconducting layer 43 of the oxide superconducting wire 45.

On a main surface 42b of the intermediate layer 42, a plurality of protruding stripe portions (orientation inhibition regions) 42a disposed in parallel at intervals are formed. The protruding stripe portion 42a is the fixing agent 16 that is linearly attached to and solidified on the main surface 41b of the substrate 41. Similar to the first protruding stripe portion 11a according to the second embodiment, the forms of the protruding stripe portion 42a are not limited to protruding stripe portions formed by the attachment and solidification of the fixing agent 16, and protruding stripe portions having different forms may be formed. The protruding stripe portions 42a can be formed using the same method as that for forming the first protruding stripe portions 11a in the second embodiment.

The protruding stripe portions 42a function as orientation inhibition regions that inhibit the orientation of the oxide superconducting layer 43 laminated on the protruding stripe portions 42a. In addition, the protruding stripe portions 42a are parts of the intermediate layer 42 and are non-orientation regions made of the fixing agent 16 having no orientations.

The heights H5 of the protruding stripe portions 42a are preferably set to 0.3 µm to 10 µm, and the widths W5 thereof are preferably set to 10 µm to 500 µm.

When the heights H5 of the protruding stripe portions 42a are set to 0.3 µm or greater, it is possible to form the non-orientation regions 43b in the oxide superconducting layer 43 in portions formed on the protruding stripe portions 42a. In addition, when the heights H5 of the protruding stripe portions 42a are set to 10 µm or smaller, it is possible to reduce influences on the orientations of regions in the oxide superconducting layer 43 in which crystals are supposed to be oriented due to the influences of the protruding stripe portions 42a.

When the widths W5 of the protruding stripe portions 42a are set to 10 µm or greater, it is possible to form the non-orientation regions 43b having a sufficient width. In addition, when the widths W5 of the protruding stripe portions 42a are set to 500 µm or smaller, it is possible to narrow the widths of non-orientation regions 43b in the oxide superconducting layer 43 and ensure the critical current density.

The orientation of the oxide superconducting layer 43 is controlled by the intermediate layer 42 (particularly, the orientation layer 42B and the cap layer 42C). In the oxide superconducting layer 43, portions formed on the protruding stripe portions 42a are not directly laminated on the intermediate layer 42 and thus serve as the non-orientation regions 43b having no orientations.

In the oxide superconducting wire 45 according to the fifth embodiment, the oxide superconducting layer 43 is substantially divided by the non-orientation regions 43b. Therefore, the oxide superconducting wire 45 has a constitution in which the oxide superconducting wire is divided into multiple filaments 50 and the multiple filaments 50 are disposed in parallel. When the oxide superconducting layer 43 is divided by the non-orientation regions 43b and the oxide superconducting layer 43 is thinned, shielding currents in the oxide superconducting wire 45, magnetization losses caused by the shielding currents, and alternating-current losses are reduced.

In the oxide superconducting wire 45 according to the present embodiment, mechanical processing using laser or the like or chemical processing by means of etching is not carried out after the lamination of the oxide superconducting layer 43. Therefore, there are no cases in which superconducting characteristics deteriorate in regions other than the orientation regions in the oxide superconducting layer 43. In addition, for the same reason, there are no cases in which the peeling resistance of the respective layers deteriorates.

In addition, in the fifth embodiment, a constitution in which the protruding stripe portions 42a are formed on the main surface 42b of the cap layer 42C in the intermediate layer 42 has been exemplified. The protruding stripe portions 42a formed in the intermediate layer 42 may be formed on the main surface of any layer (laminated layer) of the plurality of the layers constituting the intermediate layer 42. In such a case, the protruding stripe portions are capable of constituting the non-orientation regions 43b in the oxide superconducting layer 43.

Sixth Embodiment

Next, a sixth embodiment will be described.

Figure 8:
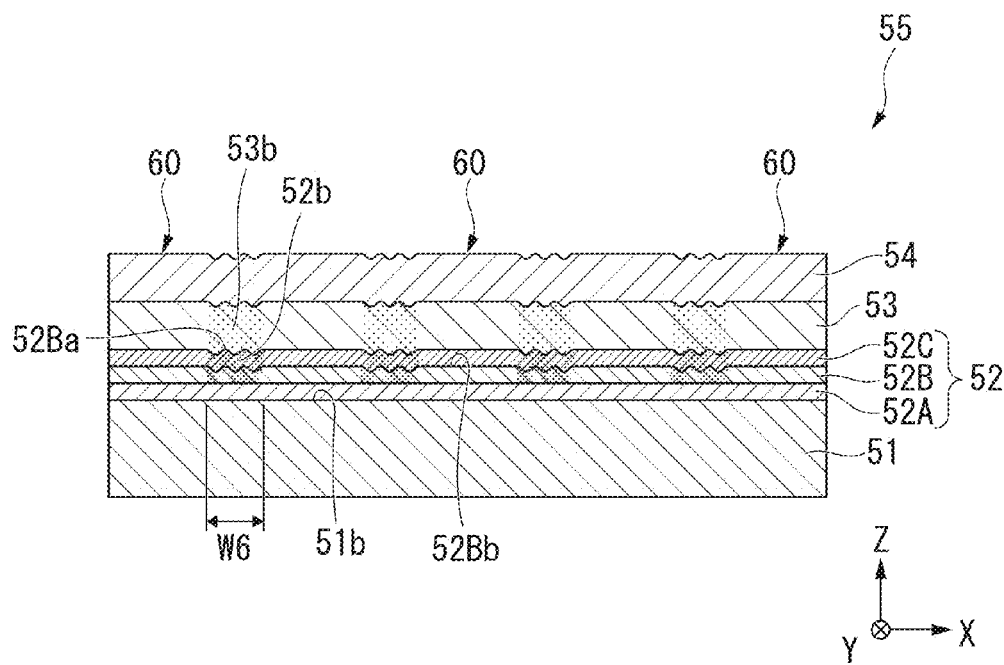
FIG. 8 is a sectional view schematically showing an oxide superconducting wire according to a sixth embodiment.

FIG. 8 is a sectional view schematically showing an oxide superconducting wire 55 according to the sixth embodiment. Hereinafter, the oxide superconducting wire 55 will be described with reference to FIG. 8.

The oxide superconducting wire 55 according to the sixth embodiment is similar to the constitution of the oxide superconducting wire 25 according to the third embodiment. The oxide superconducting wire 55 according to the sixth embodiment is different from the oxide superconducting wire 25 according to the third embodiment in terms of the locations of rough surface portions 52Ba.

As shown in FIG. 8, the oxide superconducting wire 55 has an intermediate layer 52 (a foundation layer 52A, an orientation layer 52B, and a cap layer 52C), an oxide superconducting layer 53, and a metal-stabilizing layer 54 laminated in this order on a main surface 51b of a substrate 51.

On a main surface 52Bb of the orientation layer 52B, a plurality of rough surface portions (orientation inhibition regions) 52Ba disposed in parallel at intervals are formed. The rough surface portions 52Ba are regions having an arithmetic surface roughness Ra in a range of 5 nm to 1000 nm.

In the intermediate layer 52, the regions in which the rough surface portions 52Ba are formed function as non-orientation regions. In addition, the rough surface portions 52Ba function as orientation inhibition regions that inhibit the orientation of the layer laminated on the rough surface portion 52Ba.

The widths W6 of the rough surface portions 52Ba are preferably set to 10 μm to 500 μm. When the widths W6 of the rough surface portions 52Ba are set to 10 μm or greater, it is possible to form non-orientation regions 52b in the cap layer 52C in portions formed on the rough surface portions 52Ba. In addition, in a step of forming the rough surface portions 52Ba, the orientations of the orientation regions 52B are disarrayed, and it is also possible to form non-orientation regions 52b in the orientation layer 52B. When the widths W6 of the rough surface portions 52Ba are set to 500 μm or smaller, it is possible to narrow the widths of non-orientation regions 53b in the oxide superconducting layer 53 and ensure the critical current density.

The rough surface portions 52Ba can be formed by, similar to those in the third embodiment, the radiation of laser light rays.

In the oxide superconducting layer 53, portions formed on the non-orientation regions 52b in the intermediate layer 52 serve as the non-orientation regions 53b having no orientations.

Since the orientation of the oxide superconducting layer 53 is controlled by the intermediate layer 52 (particularly, the orientation layer 52B and the cap layer 52C), the portions formed on the non-orientation regions 52b in the intermediate layer 52 are not capable of having orientations. Therefore, the oxide superconducting layer 53 formed on the non-orientation regions 52b serves as the non-orientation regions 53b.

In the oxide superconducting wire 55 according to the sixth embodiment, the oxide superconducting layer 53 is substantially divided by the non-orientation regions 53b. Therefore, the oxide superconducting wire 55 has a constitution in which the oxide superconducting wire is divided into multiple filaments 60 and the multiple filaments 60 are disposed in parallel. When the oxide superconducting layer 53 is divided by the non-orientation regions 53b and the oxide superconducting layer 53 is thinned, shielding currents in the oxide superconducting wire 55, magnetization losses caused by the shielding currents, and alternating-current losses are reduced.

In the oxide superconducting wire 55 according to the present embodiment, mechanical processing using laser or the like or chemical processing by means of etching is not carried out on the oxide superconducting layer 53 after the lamination of the oxide superconducting layer 53. Therefore, there are no cases in which superconducting characteristics deteriorate in regions other than the orientation regions in the oxide superconducting layer 53. In addition, for the same reason, there are no cases in which the peeling resistance of the respective layers deteriorates.

In the present embodiment, a constitution in which the rough surface portions 52Ba are formed in the orientation layer 52B in the intermediate layer 52 has been exemplified. The rough surface portions formed in the intermediate layer 52 may be formed on the main surface of any layer of the layers constituting the intermediate layer 52. In such a case, the rough surface portions are capable of constituting the non-orientation regions 52b in the intermediate layer 52.

EXAMPLES

Hereinafter, the invention will be described in more detail using examples, but the invention is not limited thereto.

Test Example 1

Production of Specimen

First, a tape-like substrate which was made of HASTELLOY C-276 (trade name, manufactured by Haynes International, Inc.) and had a width of 10 mm, a thickness of 0.1 mm, and a length of 1000 mm was prepared. The main surface of the substrate was polished using alumina having an average particle diameter of 3 μm. Next, the surface of the substrate was degreased and washed with acetone.

On the main surface of the substrate, first recessed grooves (recessed grooves) extending in the longitudinal direction of the substrate were formed. In the first recessed groove-processing device shown in FIG. 2, a blade having a thickness of 100 μm was mounted as the processing tool. While the substrate was transported toward the coiling reel from the delivery reel, the blade was pressed onto the width center of the substrate, thereby forming flaws (V-shaped grooves, the first recessed grooves) extending in the longitudinal direction. The substrate was partitioned in the width direction by the recessed grooves every five millimeters.

An $Al_2O_3$ film (a diffusion prevention layer; a film thickness of 100 nm) was formed on the main surface of the substrate using a sputtering method, and a $Y_2O_3$ film (a bed layer; a film thickness of 30 nm) was formed on the $Al_2O_3$ film using an ion beam sputtering method.

Next, MgO (an orientation layer; a film thickness of 5 nm to 10 nm) was formed on the bed layer using an ion-beam-assisted deposition method (IBAD method), and a 500 nm-thick $CeO_2$ film (a cap layer) was formed on the MgO film using a pulsed laser deposition method (PLD method). Next, 2.0 μm-thick $GdBa_2Cu_3O_{7-X}$ (an oxide superconducting layer) was formed on the $CeO_2$ film using the PLD method. A metal-stabilizing layer made of Ag was formed on the oxide superconducting layer using a sputtering method, and furthermore, the laminate was subjected to oxygen annealing at 500° C. for ten hours, was cooled in a furnace for 26 hours, and then was removed.

Through the above-described sequence, an oxide superconducting wire of Sample No. 1 was produced.

An oxide superconducting wire for Sample No. 2 was produced using a step obtained by removing the step of forming the first recessed grooves on the main surface of the substrate from the production sequence of the oxide superconducting wire of Sample No. 1.

Furthermore, the surface of the metal-stabilizing layer in this wire was masked using polyimide tape while forming a 100 μm-wide gap extending in the longitudinal direction in the width center of the wire. Next, the metal-stabilizing layer and the oxide superconducting layer made of $GdBa_2Cu_3O_{7-X}$ were etched using nitric acid, 100 μm-wide grooves were formed in the center of the wire, the wire was divided into a plurality of wires, and the wires were thinned. Therefore, an oxide superconducting wire of Sample No. 3 was produced.

Evaluation Method

The oxide superconducting wires of Samples No. 1 to 3 were cooled to 77 K, and alternating-current losses in the respective samples were measured using a four-terminal method in a state in which a magnetic field of 1 T was applied to the surfaces of the wires in the vertical direction. The measurement results are shown in Table 1.

TABLE 1

| Sample No. | Alternating-current loss ($J/m^3$) |
|---|---|
| 1 | $2.8 \times 10^8$ |
| 2 | $11 \times 10^8$ |
| 3 | $2.3 \times 10^8$ |

As shown in Table 1, in the oxide superconducting wire of Sample No. 1 which was divided and was formed into multiple filaments (thinned), compared with the oxide superconducting wire of Sample No. 2 which was not thinned, it was possible to reduce alternating-current losses by forming the first recessed grooves in the substrate. In addition, it was confirmed that, in the oxide superconducting wire of Sample No. 1, it was possible to suppress alternating-current losses approximately as much as in the oxide superconducting wire of Sample No. 3 in which the oxide superconducting layer was divided by means of etching and was thinned. That is, it was confirmed that it was possible to reduce alternating-current losses by dividing the oxide superconducting wire into a plurality of wires using a simple manufacturing step without performing etching and thinning the oxide superconducting wire.

Test Example 2

In the production sequence of the oxide superconducting wire of Sample No. 1, first recessed grooves having a width of 40 μm and a thickness of 5 μm were formed on the main surface of a substrate, and a silver-stabilizing layer was not formed, thereby preparing a sample.

Figure 9:
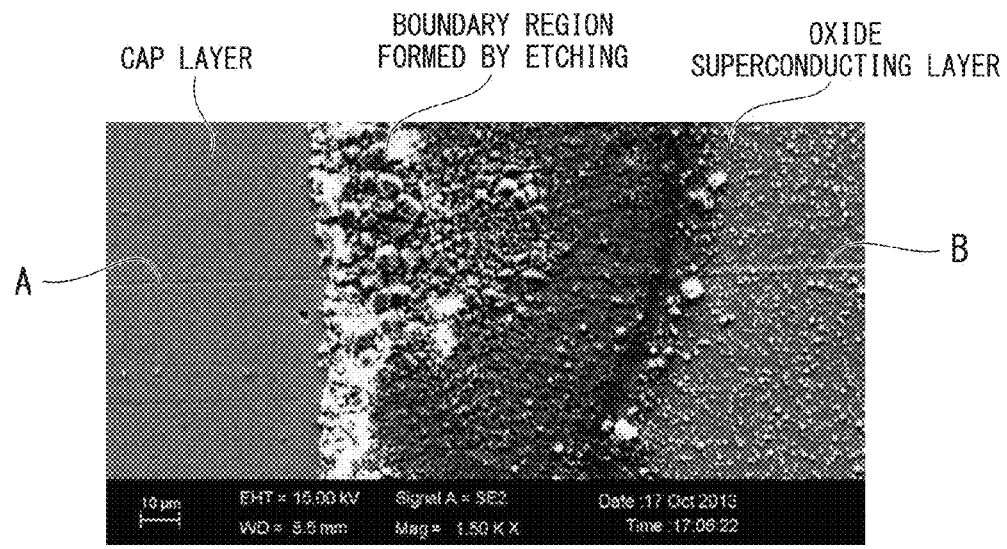
FIG. 9 is a SEM image obtained by taking an image of an oxide superconducting layer which is a sample in a test example and a part of which is etched and removed using nitric acid.

A part of the oxide superconducting layer in this sample was removed by means of etching using nitric acid. After that, an image of this portion (the etched portion) was taken so as to obtain a SEM image which is shown in FIG. 9. In FIG. 9, a region located in the left side of the image is the surface of $CeO_2$ which is the cap layer in the intermediate layer. A region located in the center of the image is a boundary region formed by etching. A region located in the right side of the image is the surface of $GdBa_2Cu_3O_{7-X}$ which is the oxide superconducting layer. In the boundary region which is located in the center of the image and is formed by etching, a state in which crystal grains of $GdBa_2Cu_3O_{7-X}$, which constitutes the oxide superconducting layer, appear is formed. That is, the oxide superconducting layer is in a state of being in the middle of etching, and the lines of the recessed grooves become invisible and are broken.

In FIG. 9, the straight line marked by Reference Sign A indicates the second recessed groove (corresponding to the second recessed groove 2a in FIGS. 1A and 1B) formed on $CeO_2$ in the intermediate layer (the cap layer) corresponding to the first recessed groove on the substrate. It is possible to confirm that the third recessed groove (corresponding to the third recessed groove 3a in FIGS. 1A and 1B) marked by Reference Sign B appears on the surface of the oxide superconducting layer due to the formation of the second recessed groove A.

Figure 10:
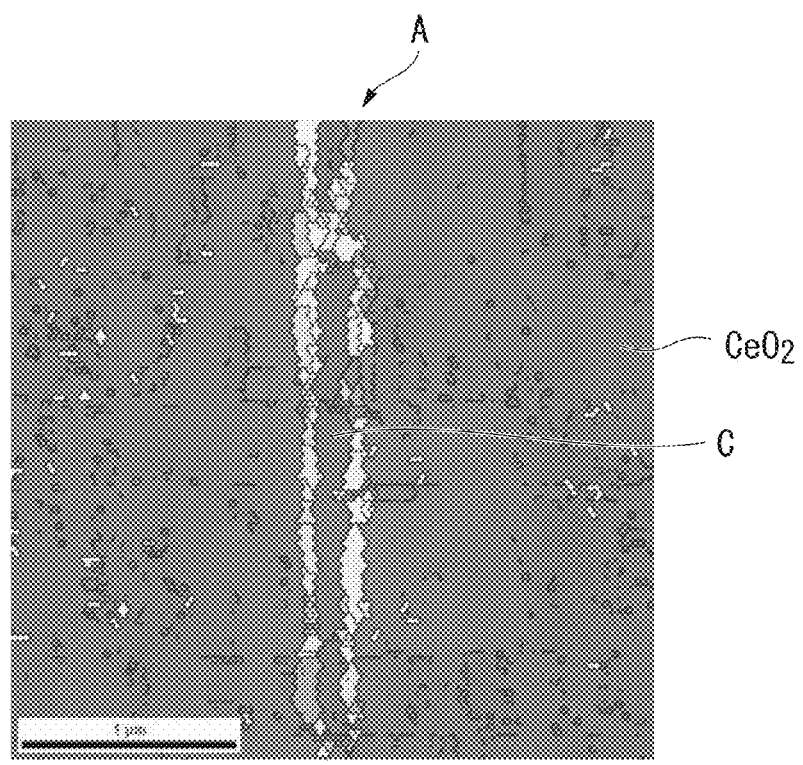
FIG. 10 is a view showing a $CeO_2$ cap layer which is a sample in the test example and is an image obtained using electron backscatter diffraction.

FIG. 10 is an image obtained using electron backscatter diffraction (EBSD) and shows a crystal orientation state at a location near the second recessed groove A on the $CeO_2$ cap layer in the above-described sample. In FIG. 10, charcoal gray portions indicate ordinary favorable crystal orientations. As shown in FIG. 10, it is possible to confirm that the non-orientation regions (corresponding to the non-orientation regions 2b in FIGS. 1A and 1B) are formed along the second recessed groove A. From this fact, it was confirmed that, when the recessed grooves are formed in the substrate, the non-orientation regions are formed in the intermediate layer formed on the recessed grooves.

In addition, in FIG. 10, in the width center region C of the second recessed groove A, crystals in the cap layer are orientated. The reasons for the width center region C having a crystal orientation being formed are considered as below.

In Test Example 2, when the first recessed grooves were formed on the main surface of the substrate, a processing tool having a blade with a flat tip center (corresponding to the processing tool 8 shown in FIG. 2) was used. Therefore, it is considered that, in the first recessed groove, the groove width center was formed to be flat, and thus a portion having oriented crystals was formed in the width central region C.

As shown in FIG. 10, even when a portion having oriented crystals is present in the width center region C, the width center region C is narrowed by two non-orientation portions, and thus the oxide superconducting layer is divided by non-orientation regions as a whole in the oxide superconducting layer. Therefore, even in this case, it is possible to reduce shielding currents, magnetization losses caused by the shielding currents, and alternating-current losses Test Example 3

First, an oxide superconducting wire of Sample No. 4 was produced. Sample No. 4 corresponds to the oxide superconducting wire according to the fourth embodiment (FIGS. 6A and 6B). For the oxide superconducting wire of Sample No. 4, the step of forming the recessed grooves on the main surface of the substrate was not carried out in the production sequence of the oxide superconducting wire of Sample No. 1, and instead, recessed grooves extending in the longitudinal direction were formed on the main surface of the orientation layer. In the step of forming the recessed grooves on the main surface of the orientation layer, first, a blade having a thickness of 100 μm (the thickness of the blade tip was approximately 20 μm) was attached as the processing tool in the recessed groove-processing device. The blade was pressed on the width center of the substrate while transporting the substrate toward the coiling reel from the delivery reel, thereby forming flaws (recessed grooves) extending in the longitudinal direction. The orientation layer was partitioned by the recessed grooves in the width direction every five millimeters. The recessed grooves formed in the orientation layer had a width of approximately 20 μm and a depth of approximately 10 μm.

Figure 11:
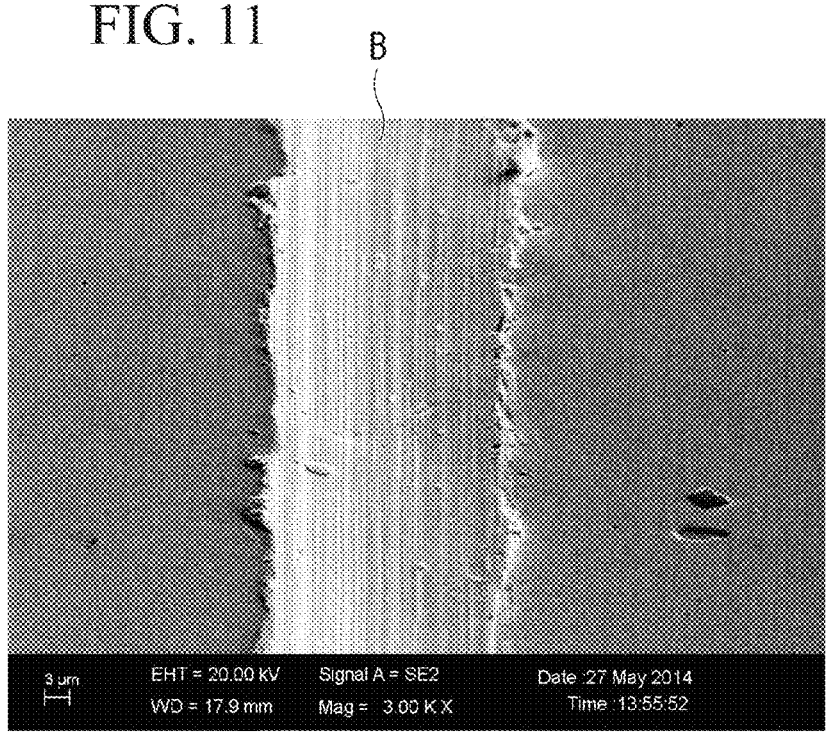
FIG. 11 is a SEM image obtained by taking an image of an orientation layer in an oxide superconducting wire which is Sample No. 4 in the test example.

FIG. 11 is a SEM image obtained by taking an image of a recessed groove B formed in the orientation layer in Sample No. 4. Particularly, FIG. 11 is an image obtained by taking an image before the formation of the cap layer and the oxide superconducting layer.

Figure 12:
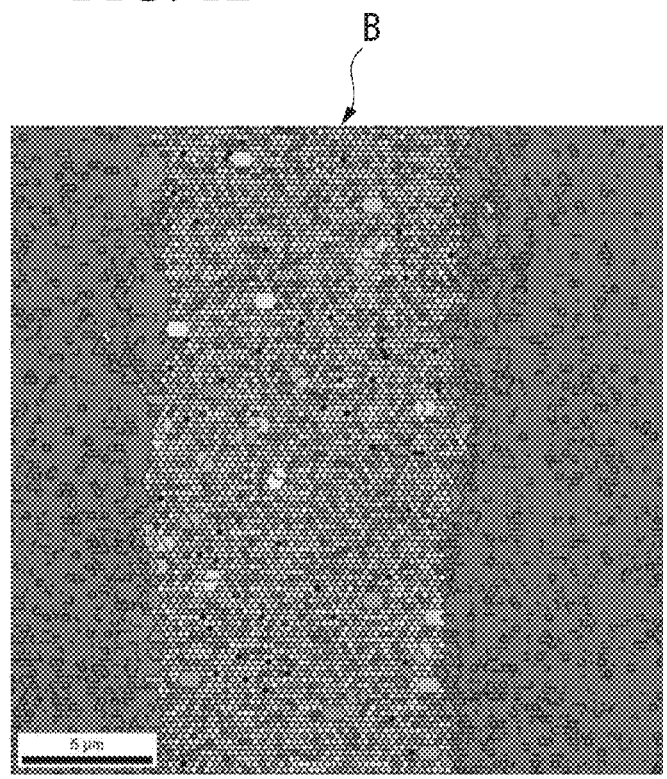
FIG. 12 is a view showing a $CeO_2$ cap layer which is Sample No. 4 in the test example and is an image obtained using electron backscatter diffraction.

In addition, FIG. 12 is an image obtained using electron backscatter diffraction (EBSD) and shows a crystal orientation state of the cap layer in Sample No. 4. In FIG. 12, charcoal gray portions indicate ordinary favorable crystal orientations. As shown in FIG. 12, it is possible to confirm that the non-orientation regions (corresponding to the non-orientation regions 32b in FIGS. 6A and 6B) are formed along the recessed groove B. From this fact, it was confirmed that, when the recessed grooves are formed in the orientation layer, the non-orientation regions are formed in the cap layer formed on the recessed grooves.

Critical Current Value

The oxide superconducting wires of Samples No. 4 and 2 (no recessed grooves) were cooled to 77 K, and the critical current values (Ic) of Samples No. 2 and 4 were measured using a four-terminal method. The critical current values Ic of Samples No. 2 and 4 are shown in Table 2.

TABLE 2

| Sample No. | Critical current value (Ic) |
|---|---|
| 2 | 621 A |
| 4 | 617 A |

As shown in Table 2, it was confirmed that a decrease in the critical current value due to the formation of the recessed grooves is not observed.

Peeling Strength

For the oxide superconducting wires of Samples No. 4 and 2 (no recessed grooves), the peeling strengths of the oxide superconducting layers were measured.

The peeling strengths were measured using the stud pull peeling tests.

In the stud pull peeling tests, the tip portion of a stud pin having a diameter of 2.7 mm was adhered and fixed to the surfaces of the metal-stabilizing layers (Ag layers) in the respective wires constituting the samples using an epoxy resin (the contact area of the pin tip portion was 5.72 mm$^2$). After that, the stud pin was pulled off from the upper surfaces of the wires in the vertical direction, and tensile loads when stresses began to decrease were measured as peeling stresses (peeling strengths).

The stud pin was adhered to the width-direction center of the wires.

In the stud pull peeling test, first, 30 pieces of Sample No. 4 and 30 pieces of Sample No. 2 (no recessed grooves) were prepared, and the stud pull peeling tests were carried out on all the samples. The average value of the measurement results for the 30 pieces of Sample No. 4 and the average value of the measurement results for the 30 pieces of Sample No. 2 were computed. The computation results are shown in Table 3. In the respective samples, peeling occurred between the oxide superconducting layers and the cap layers.

TABLE 3

| Sample No. | Peeling force average value (MPa) |
|---|---|
| 2 | 50.8 |
| 4 | 58.1 |

As shown in Table 3, in Sample No. 4 in which the recessed grooves were formed in the orientation layer, the average value of the peeling force was high, and the peeling resistance improved. This is considered to be because protrusions and recesses were formed between the oxide superconducting layer and the cap layer by the recessed grooves, and the peeling resistance improved due to an anchoring effect.

Width-Direction Resistance Values

The oxide superconducting wires of Samples No. 4 and 2 (no recessed grooves) were cooled to 77 K, and the resistance values in the width direction of Samples No. 2 and 4 were measured. The width-direction resistance values of the respective samples are shown in Table 4.

TABLE 4

| Sample No. | Width-direction resistance value (μΩ) |
|---|---|
| 2 | 0.0 |
| 4 | 6.4 |

As shown in Table 4, in Sample No. 4 in which the recessed grooves were formed in the orientation layer, resistance values were generated in the width direction. From this fact, it was confirmed that the oxide superconducting wire was divided in the width direction and the wire was thinned.

Test Example 4

In Test Example 1 described above, the 10 mm-wide substrate was used; however, in Test Example 4, a 4 mm-wide substrate obtained by cutting the side portions of the 10 mm-wide substrate was used as a sample substrate. In order to obtain the 4 mm-wide substrate, a 10 mm-wide substrate was prepared, parts of the substrate were cut off from both sides of the substrate in the width direction, thereby obtaining a 4 mm-wide substrate.

In Test Example 4, Sample No. 5 (dually-divided wire) in which one recessed groove was formed on the 4 mm-wide substrate and Sample (No. 6) in which no recessed grooves were formed were prepared. Specifically, Sample No. 5 was a wire in which a recessed groove was formed in the extension direction of the substrate in the width-direction center of the 4 mm-wide substrate. That is, Sample No. 5 was a dually-divided wire divided by one recessed groove.

Sample No. 6 was a wire in which no recessed grooves were formed and was a non-divided wire.

Next, a method of producing the samples (Samples No. 5 and 6) in Test Example 4 will be described. The intermediate layer 32 (the foundation layer 32A, the orientation layer 32B, and the cap layer 32C), the oxide superconducting layer 33, and the metal-stabilizing layer 34 were laminated in this order on the main surface 31b of the 4 mm-wide substrate 31 so as to obtain a layer structure described in the fourth embodiment (FIGS. 6A and 6B). Particularly, as the metal-stabilizing layer 34, a bilayer structure of a silver layer or a copper layer which was formed using a sputtering method and a copper layer which was formed using a plating method was employed. That is, the oxide superconducting wire used in Test Example 4 can be said to be a modification example of the fourth embodiment.

Furthermore, similar to the method described in the fourth embodiment, when the intermediate layer 32 was formed, a processing tool was pressed onto the main surface 32Bb of the orientation layer 32B, and the substrate 31 was moved, thereby forming the recessed groove 32Ba. After that, on the main surface 32Bb of the orientation layer 32B, the cap layer 32C, the oxide superconducting layer 33, an Ag thin film, and a Cu thin film 34 were sequentially formed.

A wire obtained by forming one recessed groove 32Ba in the orientation layer 32B when the recessed groove 32Ba was formed (dually-divided wire) was the wire of Sample No. 5. A wire in which the recessed groove 32Ba was not formed in the orientation layer 32B (non-divided wire) was the wire of Sample No. 6.

In Sample No. 5, since the metal-stabilizing layer 34 was formed, currents flow between multiple filaments obtained by division.

Measurement of Magnetization Losses in Wires

Figure 13:
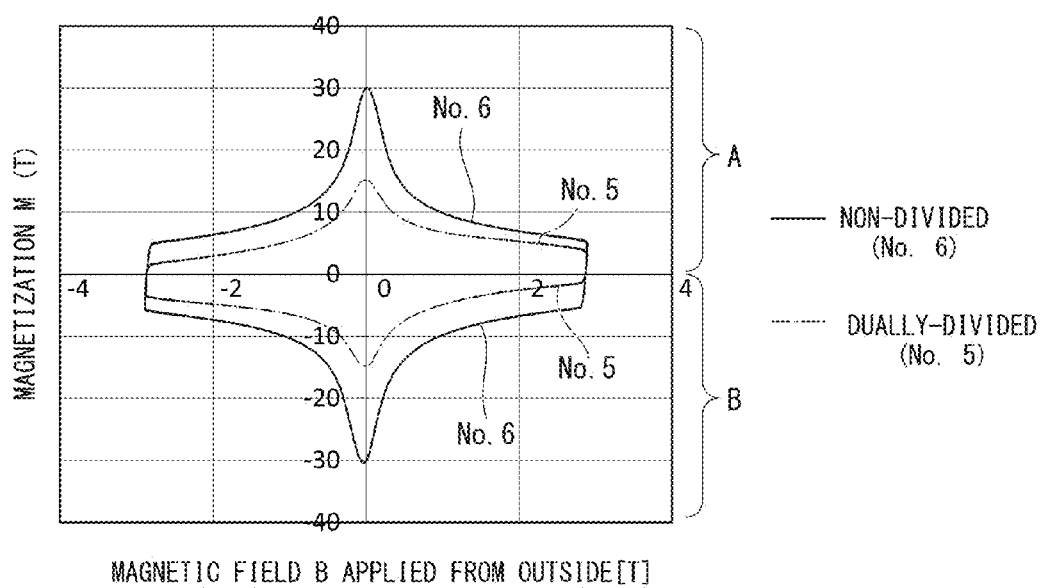
FIG. 13 is a graph showing the measurement results of magnetization losses in Samples No. 5 and 6 in the test example.

FIG. 13 is a graph showing the measurement results of magnetization losses in Samples No. 5 and 6 in Test Example 4. In FIG. 13, the horizontal axis indicates a magnetic field B (T) applied from the outside, and the vertical axis indicates magnetization (T). As the measurement conditions, the temperature was 64 K (absolute temperature), and magnetization was measured by applying a magnetic field in a direction perpendicular to the oxide superconducting layer while varying the magnetic field so as to obtain values shown along the vertical axis.

The results shown in FIG. 13 show that, in a magnetic field showing the same value, for example, in a case in which the magnetic field was 0 (T), magnetization in the non-divided wire (Sample No. 6) showed values of approximately 30 (T) and approximately −30 (T), and magnetization in the dually-divided wire (Sample No. 5) showed values of approximately 15 (T) and approximately −15 (T).

From the above-described results, it is found that, in a case in which the magnetic field was 0 (T), the absolute value of the magnetization in Sample No. 6 was greater than the absolute value of the magnetization in Sample No. 5.

In addition, the above-described result is not limited to the case in which the magnetic field is 0 (T), and it is found that, under the same magnetic field conditions, the magnetization relationship between Samples No. 5 and 6 is identical. However, it is found that, while the difference between Samples No. 5 and 6 at a magnetic field of 0 (T) was approximately 15 (T), as the magnetic field varies from 0 (T) to approximately 2, 9 (T) or the magnetic field varies from 0 (T) to approximately −2, 9 (T), the difference becomes smaller. From this fact, it is found that, when Sample No. 6 in which no recessed grooves were formed and Sample No. 5 in which the recessed groove was formed are compared with each other, the degree (absolute value) of magnetization can be reduced by linearly forming the recessed groove. That is, in the case of the dually-divided wire, the degree of magnetization can be reduced.

Generally, it is known that magnetization is caused in association with shielding currents. Specifically, in a case in which a shielding current is high, the magnetization amount also becomes high. Therefore, from the results that the absolute value of the magnetization in Sample No. 7 was high and the absolute value of magnetization was lower in Sample No. 5 which was a divided wire than in Sample No. 6, it is found that the shielding currents in Sample No. 5 were lower than the shielding currents in Sample No. 6. That is, it has been clarified that Sample No. 5 which was a divided wire was capable of obtaining an effect that the generation of shielding currents could be suppressed. From this result, it is found that, in Sample No. 5 which was a divided wire, magnetization losses could be reduced.

Magnetooptic Observation

Figure 14A:
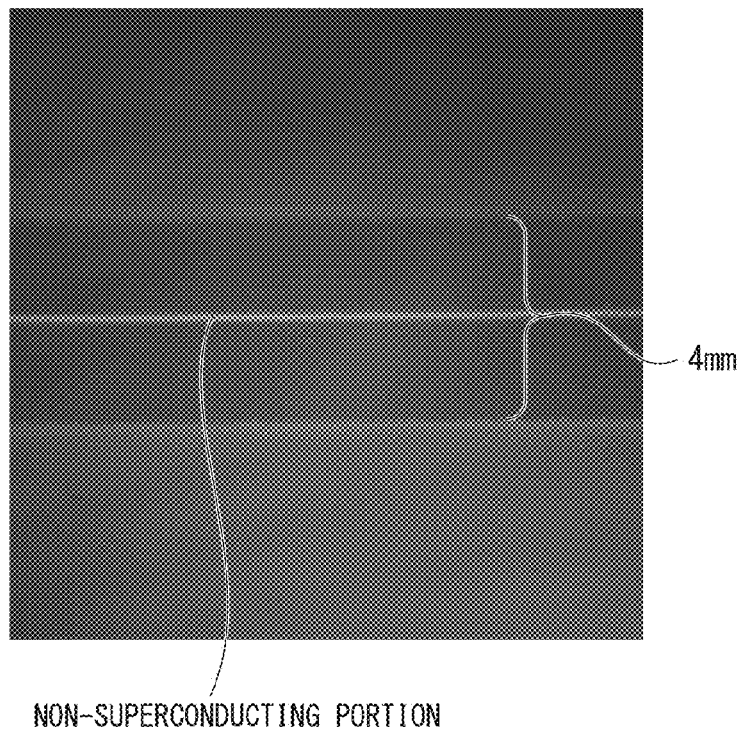
FIG. 14A is a view showing Sample No. 5 (dually-divided wire) in the test example and is an image obtained by taking an image by means of magnetooptic observation.
Figure 14B:
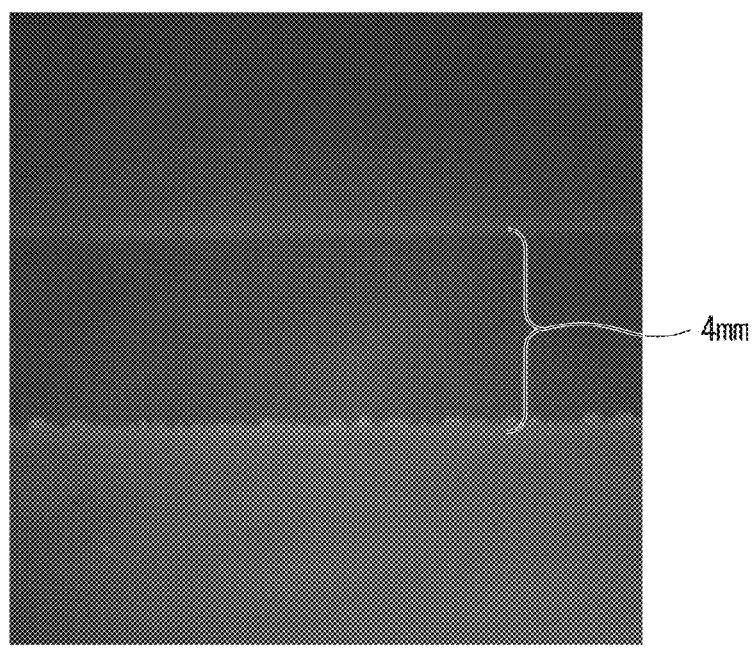
FIG. 14B is a view showing Sample No. 6 (non-divided wire) in the test example and is an image obtained by taking an image by means of magnetooptic observation.

FIG. 14A is a view showing Sample No. 5 (dually-divided wire) in the test example and is an image obtained by taking an image by means of magnetooptic observation. FIG. 14B is a view showing Sample No. 6 (not-divided wire) in the test example and is an image obtained by taking an image by means of magnetooptic observation.

It is known that, in the magnetooptic observation, when the oxide superconducting layer was observed in a state in which a magnetic field was applied to the oxide superconducting layer, superconducting portions and non-superconducting portions showed different responses. When Sample No. 5 (dually-divided wire) was observed by means of magnetooptic observation in which the properties of the above-described superconducting portions and non-superconducting portions were used, as shown in FIG. 14A, non-superconducting portions were observed in the center of the wire having a wire width of 4 mm. On the other hand, when Sample No. 6 (non-divided wire) was observed by means of magnetooptic observation, as shown in FIG. 14B, non-superconducting portions were not observed, and superconducting portions were observed in the entire region on the substrate.

Measurement of Alternating-Current Losses in Wires

Figure 15:
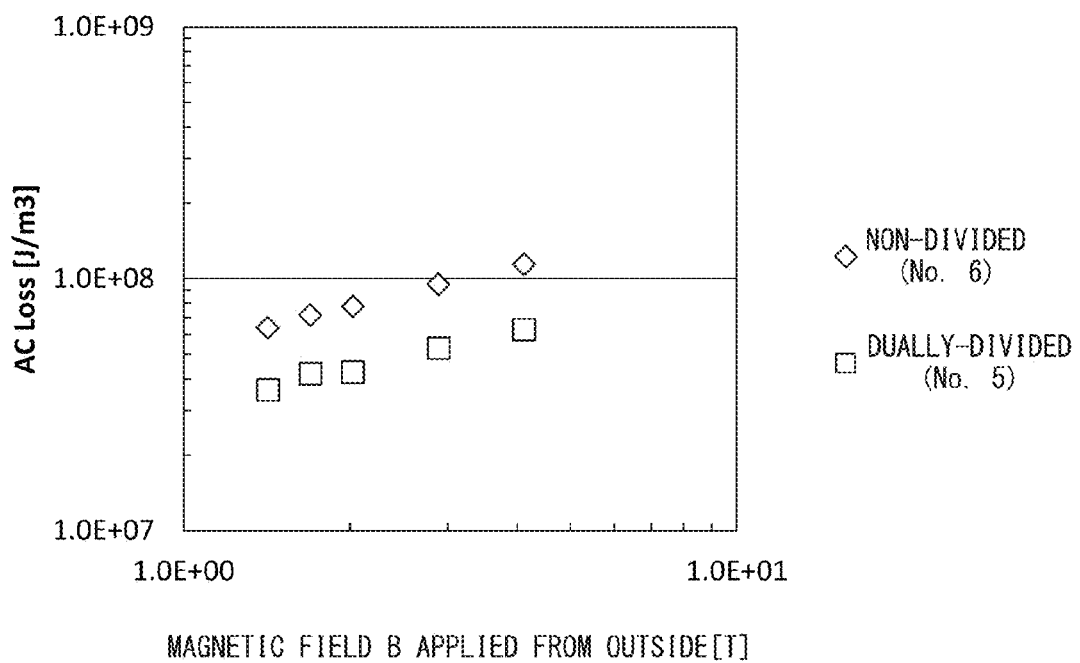
FIG. 15 is a graph showing the measurement results of alternating-current losses in Samples No. 5 and 6 in the test example.

FIG. 15 is a graph showing the measurement results of alternating-current losses in Samples No. 5 and 6 in Test Example 4. In FIG. 15, the horizontal axis indicates a magnetic field B (T) applied from the outside, and the vertical axis indicates alternating-current losses (AC Loss, $J/m^3$ cycle). As the measurement conditions, the temperature was 64 K (absolute temperature), and magnetization was measured by applying a magnetic field in a direction perpendicular to the oxide superconducting layer while varying the magnetic field so as to obtain values shown along the vertical axis. A computation method called a magnetization method was employed, and alternating-current losses were calculated from the measured values of magnetization. In the measurement of alternating-current losses, the maximum applied magnetic field is plotted along the horizontal axis, and the loss amount per cycle is considered as an alternating-current loss and is plotted along the vertical axis.

As a result of calculating the alternating-current losses in Samples No. 5 and 6, the results shown in FIG. 15 were obtained. As main calculation values, the following calculation values can be listed. That is, at a magnetic field of approximately 1.42 (T), the alternating-current loss in Sample No. 5 was approximately $3.61 \times 10^7$ ($J/m^3$), and the alternating-current loss in Sample No. 6 was approximately $6.39 \times 10^7$ ($J/m^3$). In addition, at a magnetic field of approximately 2.03 (T), the alternating-current loss in Sample No. 5 was approximately $4.26 \times 10^7$ ($J/m^3$), and the alternating-current loss in Sample No. 6 was approximately $7.76 \times 10^7$ ($J/m^3$). In addition, at a magnetic field of approximately 4.12 (T), the alternating-current loss in Sample No. 5 was approximately $6.26 \times 10^7$ ($J/m^3$), and the alternating-current loss in Sample No. 6 was approximately $1.14 \times 10^8$ ($J/m^3$).

From these results, it is found that the alternating-current losses in Sample No. 6 which was a non-divided wire were approximately 1.8 times those in Sample No. 5 which was a dually-divided wire. From this result, it is found that, in Sample No. 5 which was a dually-divided wire, alternating-current losses can be reduced.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description, and is only limited by the scope of the appended claims.

For example, in the above-described embodiments, cases in which the orientation inhibition regions were formed in specific layers have been exemplified. However, the layers in which the orientation inhibition regions were formed may be the substrate or any layers in the intermediate layer. That is, orientation inhibition regions may be formed in any layers as long as the layers are formed below the oxide superconducting layer.

REFERENCE SIGNS LIST 1, 11, 21, 31, 41, 51 . . . substrate, 1a, 32Ba . . . recessed groove (first recessed groove, orientation inhibition region), 1b, 11b, 21b, 31b, 41b, 51b . . . main surface, 2, 12, 22, 32, 42, 52 . . . intermediate layer, 2A, 12A, 22A, 32A, 42A, 52A . . . foundation layer, 2B, 12B, 22B, 32B, 42B, 52B . . . orientation layer, 2C, 12C, 22C, 32C, 42C, 52C . . . cap layer, 2a . . . second recessed groove, 2b, 3b, 12b, 13b, 22b, 23b, 32b, 33b, 43b, 52b, 53b . . . non-orientation region, 3, 13, 23, 33, 43, 53 . . . oxide superconducting layer, 4, 14, 24, 34, 44, 54 . . . metal-stabilization layer, 5, 15, 25, 35, 45, 55 . . . oxide superconducting wire, 6 . . . delivery reel, 7 . . . coiling reel, 8 . . . processing tool, 9 . . . first concave groove-processing device, 10, 20, 30, 40, 50, 60 . . . filament, 11a, 42a . . . protruding stripe portion (first protruding stripe portion, orientation inhibition region), 12a . . . second protruding stripe portion, 16 . . . fixing agent, 18 . . . coating section, 19 . . . first convex stripe-processing device, 21a, 52Ba . . . rough surface portion (first rough surface portion, orientation inhibition region), 22a . . . second rough surface portion, 32Bc . . . bump portion

The invention claimed is:

1. An oxide superconducting wire formed into multiple filaments, comprising:
a substrate;
an intermediate layer laminated on a main surface of the substrate, the intermediate layer having one or more layers having an orientation, the intermediate layer having one or more non-orientation regions extending in a longitudinal direction of the wire;
an oxide superconducting layer laminated on the intermediate layer, the oxide superconducting layer having a crystal orientation controlled by the intermediate layer, the oxide superconducting layer having non-orientation regions located on the non-orientation regions in the intermediate layer; and
orientation inhibition regions provided on the main surface of the substrate or a main surface of any layer of layers constituting the intermediate layer, wherein:
the orientation inhibition regions are regions that inhibit crystal orientations in layers laminated on the orientation inhibition regions and form the non-orientation regions;
the orientation inhibition regions are recessed grooves formed on the main surface of the substrate or the main surface of any layer of the layers constituting the intermediate layer;
the intermediate layer has an orientation layer and a cap layer laminated on the orientation layer;
the oxide superconducting layer is laminated on the cap layer; and
the recessed grooves is covered with the cap layer.

2. The oxide superconducting wire according to claim 1, wherein
the orientation inhibition regions are protruding stripe portions formed on the main surface of the substrate or the main surface of any layer of the layers constituting the intermediate layer.

3. The oxide superconducting wire according to claim 1, wherein
the orientation inhibition regions are rough surface portions formed on the main surface of the substrate or the main surface of any layer of the layers constituting the intermediate layer, and
the rough surface portions are regions having a relatively greater arithmetic average roughness Ra than portions in which the rough surface portions are not formed.

4. The oxide superconducting wire according to claim 3, wherein
the arithmetic average roughness Ra of the rough surface portions is 5 nm to 1000 nm.

5. A method of manufacturing an oxide superconducting wire, comprising:
preparing a substrate having a main surface;
forming one or more orientation inhibition regions in a longitudinal direction of the wire on the main surface of the substrate;
laminating an intermediate layer formed of two or more layers comprising an orientation layer and a can layer laminated on the orientation layer on the main surface of the substrate and the orientation inhibition regions after the orientation inhibition regions are formed;
laminating an oxide superconducting layer having crystal orientations controlled by the intermediate layer on the intermediate layer;
forming non-orientation regions in the oxide superconducting layer located on the orientation inhibition regions; and
forming the oxide superconducting wire into multiple filaments, wherein:
the orientation inhibition regions are regions that inhibit crystal orientations in layers laminated on the orientation inhibition regions and form the non-orientation regions;
the orientation inhibition regions are first recessed grooves;
the first recessed grooves are formed on the main surface when forming the orientation inhibition regions; and
the first recessed grooves are covered with the cap layer, second recessed grooves are formed such that the first recessed grooves are transferred on a surface of the cap layer, and the oxide superconducting layer is laminated on the cap layer.

6. A method of manufacturing an oxide superconducting wire, comprising:
preparing a substrate having a main surface;
laminating an intermediate layer formed of two or more layers comprising an orientation layer and a cap layer laminated on the orientation layer on the main surface of the substrate;

after any layer of the layers constituting the intermediate layer is laminated, forming one or more orientation inhibition regions in a longitudinal direction of the wire on the main surface of the laminated layer;
laminating an oxide superconducting layer having crystal orientations controlled by the intermediate layer on the intermediate layer and the orientation inhibition regions;
forming non-orientation regions in the oxide superconducting layer located on the orientation inhibition regions; and
forming the oxide superconducting wire into multiple filaments, wherein:
the orientation inhibition regions are regions that inhibit crystal orientations in layers laminated on the orientation inhibition regions and form the non-orientation regions;
the orientation inhibition regions are first recessed grooves;
the first recessed grooves are formed on the main surface when forming the orientation inhibition regions; and
the first recessed grooves are covered with the cap layer, and the oxide superconducting layer is laminated on the cap layer.

7. The method of manufacturing an oxide superconducting wire according to claim 5, wherein
when forming the orientation inhibition regions, the recessed grooves are formed by pressing a processing tool onto the main surface and moving the wire in the longitudinal direction.

8. A method of manufacturing an oxide superconducting wire, comprising:
preparing a substrate having a main surface;
forming one or more orientation inhibition regions in a longitudinal direction of the wire on the main surface of the substrate;
laminating an intermediate layer formed of one or more layers on the main surface of the substrate and the orientation inhibition regions after the orientation inhibition regions are formed;
laminating an oxide superconducting layer having crystal orientations controlled by the intermediate layer on the intermediate layer;
forming non-orientation regions in the oxide superconducting layer located on the orientation inhibition regions; and
forming the oxide superconducting wire into multiple filaments, wherein:
the orientation inhibition regions are regions that inhibit crystal orientations in layers laminated on the orientation inhibition regions and form the non-orientation regions;
the orientation inhibition regions are first protruding stripe portions;
the first protruding stripe portions are formed on the main surface when forming the orientation inhibition regions; and
second protruding stripe portions are formed such that the first protruding stripe portions are transferred on a surface of the intermediate layer formed on the first protruding stripe portions.

9. The method of manufacturing an oxide superconducting wire according to claim 8, wherein
when forming the orientation inhibition regions, the first protruding stripe portions are formed by attaching a fixing agent to the main surface.

10. A method of manufacturing an oxide superconducting wire, comprising:
preparing a substrate having a main surface;
forming one or more orientation inhibition regions in a longitudinal direction of the wire on the main surface of the substrate;
laminating an intermediate layer formed of one or more layers on the main surface of the substrate and the orientation inhibition regions after the orientation inhibition regions are formed;
laminating an oxide superconducting layer having crystal orientations controlled by the intermediate layer on the intermediate layer;
forming non-orientation regions in the oxide superconducting layer located on the orientation inhibition regions; and
forming the oxide superconducting wire into multiple filaments, wherein:
the orientation inhibition regions are regions that inhibit crystal orientations in layers laminated on the orientation inhibition regions and form the non-orientation regions;
the orientation inhibition regions are rough surface portions; and
the rough surface portions are formed on the main surface when forming the orientation inhibition regions.

11. The method of manufacturing an oxide superconducting wire according to claim 10, wherein
when forming the orientation inhibition regions, the rough surface portions are formed by radiating laser light rays on the main surface.

12. The method of manufacturing an oxide superconducting wire according to claim 6, wherein
the orientation inhibition regions are recessed grooves, and
the recessed grooves are formed on the main surface of the laminated layer when forming the orientation inhibition regions.

13. The method of manufacturing an oxide superconducting wire according to claim 12, wherein
when forming the orientation inhibition regions, the recessed grooves are formed by pressing a processing tool onto the main surface of the laminated layer and moving the wire in the longitudinal direction.

14. The method of manufacturing an oxide superconducting wire according to claim 6, wherein
when forming the orientation inhibition regions, the recessed grooves are formed by pressing a processing tool onto the main surface and moving the wire in the longitudinal direction.

15. A method of manufacturing an oxide superconducting wire, comprising:
preparing a substrate having a main surface;
laminating an intermediate layer formed of two or more layers on the main surface of the substrate;
after any layer of the layers constituting the intermediate layer is laminated, forming one or more orientation inhibition regions in a longitudinal direction of the wire on the main surface of the laminated layer;
laminating an oxide superconducting layer having crystal orientations controlled by the intermediate layer on the intermediate layer and the orientation inhibition regions;
forming non-orientation regions in the oxide superconducting layer located on the orientation inhibition regions; and forming the oxide superconducting wire into multiple filaments, wherein:

the orientation inhibition regions are regions that inhibit crystal orientations in layers laminated on the orientation inhibition regions and form the non-orientation regions;

the orientation inhibition regions are first protruding stripe portions;

the first protruding stripe portions are formed on the main surface when forming the orientation inhibition regions; and second protruding stripe portions are formed such that the first protruding stripe portions are transferred on a surface of the intermediate layer formed on the first protruding stripe portions.

16. The method of manufacturing an oxide superconducting wire according to claim 15, wherein when forming the orientation inhibition regions, the first protruding stripe portions are formed by attaching a fixing agent to the main surface.

17. The oxide superconducting wire according to claim 8, wherein heights of the first protruding stripe portions are 0.3 μm to 10 μm and widths of the first protruding stripe portions are 10 μm to 500 μm.

18. The oxide superconducting wire according to claim 15, wherein heights of the first protruding stripe portions are 0.3 μm to 10 μm and widths of the first protruding stripe portions are 10 μm to 500 μm.

19. A method of manufacturing an oxide superconducting wire, comprising:

preparing a substrate having a main surface;

laminating an intermediate layer formed of one or more layers on the main surface of the substrate;

after any layer of the layers constituting the intermediate layer is laminated, forming one or more orientation inhibition regions in a longitudinal direction of the wire on the main surface of the laminated layer;

laminating an oxide superconducting layer having crystal orientations controlled by the intermediate layer on the intermediate layer and the orientation inhibition regions;

forming non-orientation regions in the oxide superconducting layer located on the orientation inhibition regions; and forming the oxide superconducting wire into multiple filaments, wherein the orientation inhibition regions are regions that inhibit crystal orientations in layers laminated on the orientation inhibition regions and form the non-orientation regions;

the orientation inhibition regions are rough surface portions; and the rough surface portions are formed on the main surface when forming the orientation inhibition regions.

20. The method of manufacturing an oxide superconducting wire according to claim 6, wherein when forming the orientation inhibition regions, the recessed grooves are formed by pressing a processing tool onto the main surface and moving the wire in the longitudinal direction.

21. The oxide superconducting wire according to any one of claim 10, wherein the widths of the rough surface portions are 10 μm to 500 μm.

22. The oxide superconducting wire according to any one of claim 19, wherein the widths of the rough surface portions are 10 μm to 500 μm.

* * * * *